United States Patent
Lin et al.

[19]

[11] Patent Number: 5,999,455
[45] Date of Patent: Dec. 7, 1999

[54] CHANNEL FN PROGRAM/ERASE RECOVERY SCHEME

[75] Inventors: Yu-Shen Lin, Taipei; Tzeng-Huei Shiau, Hsin-Pu, both of Taiwan; Ray-Lin Wan, Fremont, Calif.

[73] Assignee: Macronix International Co., Ltd., Hsinchu, Taiwan

[21] Appl. No.: 09/162,108

[22] Filed: Sep. 28, 1998

Related U.S. Application Data

[63] Continuation of application No. PCT/US98/12426, Jun. 12, 1998.

[51] Int. Cl.$^6$ ................................................. G11C 16/00
[52] U.S. Cl. ................................ 365/185.24; 365/185.3
[58] Field of Search ..................... 365/185.24, 185.29, 365/185.3, 185.23, 185.25, 185.27, 185.28, 185.09

[56] References Cited

U.S. PATENT DOCUMENTS

| | | | |
|---|---|---|---|
| 5,400,286 | 3/1995 | Chu et al. | 365/185.24 |
| 5,530,669 | 6/1996 | Oyama | 365/185.29 |
| 5,729,494 | 3/1998 | Gotou et al. | 365/185.24 |

*Primary Examiner*—Tan T. Nguyen
*Attorney, Agent, or Firm*—Haynes & Beffel LLP

[57] ABSTRACT

A recovery circuit for recovering the control gate and the channel well of a floating gate memory cell to a first recovery potential and a second recovery potential respectively after a program or erase process has been performed on the cell is provided. The floating gate memory cell may include the control gate coupled to a first node at a first program/erase potential, a floating gate, the channel well coupled to a second node at a second program/erase potential having a first conductivity type, and drain and source regions within the channel well having a second conductivity type different from the first. The recovery circuit includes control circuitry that provides a recovery control signal indicating when the program or erase process has been completed, and a coupling circuit that connects the control gate to the channel well in response to the recovery control signal. The recovery circuit further includes first and second voltage detectors that generate first and second grounding signals when the control gate and channel well voltages reach a first and second switching voltage respectively. The first and second grounding signals are provided to first and second voltage grounding circuits that bias the control gate and the channel well to the first and second recovery potentials respectively in response to the grounding signals. In one embodiment the first and second recovery potentials are connected to a node at ground potential, and in another embodiment the first conductivity type is p-type. In a further embodiment the floating gate memory cell is a triple well transistor, the channel well of which is within an isolation well on the substrate of an integrated circuit.

61 Claims, 11 Drawing Sheets

WORD LINE DRIVER

CHANNEL FN PROGRAM/ERASE RECOVERY SCHEME

This is a continuation of copending International Application PCT/US98/12426, with an international filing data of Jun. 12, 1998.

BACKGROUND OF THE INVENTION a. Field of the Invention

The present invention relates to the programming and erasing of nonvolatile memory devices. More particularly, the present invention relates to a scheme for flash cell recovery from a Fowler-Nordheim tunneling program and/or erase process.

b. Description of Related Art

Flash memory is a class of nonvolatile memory integrated circuits, based on floating gate transistors. The memory state of a floating gate cell is determined by the concentration of charge trapped in the floating gate. The operation of flash memory is largely dependent on the techniques used for injected or removing charge from the floating gate.

There are at least two basic techniques utilized for moving charge into and out of floating gate memory cells. A first technique is referred to as hot electron injection. Hot electron injection is induced by applying a positive voltage between the drain and source of the memory cell, and a positive voltage to the control gate. This induces a current in the cell, and hot electrons in the current are injected through the tunnel oxide of the floating gate cell into the floating gate. Hot electron injection is a relatively high current operation, and is therefore usually limited to use for programming a few cells at a time in the device.

A second major technique for moving charge into and out of the floating gate of flash memory cells is referred to as Fowler-Nordheim tunneling (F-N tunneling). F-N tunneling is induced by establishing a large electric field between the control gate and one of the drain, source, and channel or between the control gate and a combination of these terminals. The electric field establishes a F-N tunneling current through the tunnel oxide and can be used for both injecting electrons into the floating gate, and driving electrons out of the floating gate. The F-N tunneling process is relatively low-current, because it does not involve a current flowing between the source and drain of the cells. Thus, it is commonly used in parallel across a number of cells at a time on a device.

Operation of flash memory involves programming the array, which requires a cell-by-cell control of the amount of charge stored in the floating gate, and erasing by which an entire array or a sector of the array is cleared to a predetermined charge state in the floating gate. In one kind of flash memory, F-N tunneling is used both for programming and for erasing cells in the array.

The F-N tunneling erase used in prior approaches, has been a limiting factor on the ability to use low supply voltages (VDD less than 5 volts) with the integrated circuit chips. For example, one common approach is based on a memory cell formed in a p-type semiconductor substrate having n-type source and drain regions. A source-side F-N tunneling erase operation is biased by applying an erasing potential of about twelve volts to the source, grounding the substrate, and setting the word line connected to the control gate of the cells to be erased at zero volts. Thus, an erase operation is achieved by F-N tunneling between the source and the floating gate. However, a large voltage difference (12 volts) is established between the source and the substrate. This voltage difference induces unwanted substrate current and hot hole current. To suppress the unwanted current a so-called double diffusion source process is used. The double diffusion creates a gradual or two stage change in concentration of n-type doping between the source and the substrate. This reduces the stress at the interface between the source and the substrate, and suppresses the unwanted current. However, the double diffusion source limits the ability to shrink the size of the cell.

An alternative approach involves the use of a triple well floating gate memory such as that disclosed in International Patent Application No. PCT/US97/03861, entitled "Triple Well Floating Gate Memory and Operating Method with Isolated Channel Program, Preprogram and Erase Processes", invented by Ray-Lin Wan and Chun-Hsiung Hung, and assigned to the assignee of the present invention. In one embodiment of this approach, the flash cell is formed in a p-type substrate, in which a deep n-well (NWD) is formed within a p-well inside (PWI). N-type source and drain regions are formed within the PWI. A typical manner of F-N programming of this triple well floating gate arrangement is illustrated with respect to FIG. 1, in which it is shown that the p-substrate is connected to ground, the NWD to a small positive voltage of approximately 3 volts, the PWI, source, and drain are connected to a negative voltage of approximately −9 volts, and the gate is connected to a positive voltage of approximately 8 volts. A typical manner of F-N erasing of this triple well floating gate arrangement is illustrated with respect to FIG. 2, in which it is shown that the p-substrate is connected to ground, the NWD to a large positive voltage of approximately 10 volts, the PWI, source, and drain are connected to a positive voltage of approximately 6 volts, and the gate is connected to a negative voltage of approximately −9 volts. After performing a program or erase of the cell, the potentials applied to the nodes must be moved away and recovered to ground potential, this is known as the recovery of the cell.

In designing a scheme to program and erase a triple well floating gate cell as illustrated in FIGS. 1 and 2, one major factor to be considered is the speed at which the program/erase functions can be performed. The speed at which the cell can recover from the high voltages applied to the various cell nodes is a major determinant of the overall speed of the program/erase scheme. One factor having a very large effect on the recovery time of a particular program/erase scheme is the parasitic capacitance that is formed between the various nodes of the floating gate cell. These capacitances are illustrated in FIGS. 1 and 2 as C1 (the gate to PWI capacitor), C2 (the PWI to NWD junction capacitor), and C3 (the NWD to P-substrate junction capacitor). Thus far, three conventional schemes have been used to discharge C1, C2, C3, and recover all the terminals of the cell to ground.

The first scheme is illustrated in FIGS. 3(a)–(c) with respect to a recovery from a program step. This scheme consists of first connecting the cell's gate to ground via a highly conductive path, thereby coupling node PWI to a lower potential by capacitor C1 (−17 volts in this case) since PWI is connected to −9 V by a low conductive path. Thus, in order to reduce this coupling, this scheme is typically modified by connecting the gate to ground by a low conductive path and consequently prolonging the recovery time. Further, as shown in FIG. 3(b), a voltage limiter D3 is also typically provided in order to provide the node with protection from a high voltage stress caused by a miscalculated coupling. After the gate terminal is discharged to ground, PWI is discharged to ground via another path. At this moment, the same coupling problem appears again. As illustrated in FIG. 3(c), the gate will be coupled to a positive potential by C1 if the gate-to-ground path is not highly conductive enough to maintain the gate at ground, and NWD is thus coupled to +12 volts via C2. Therefore, this particular recovery scheme requires a negative potential limiter D3, and two separate drivers to connect the gate to ground at different time intervals. A weak gate driver is needed for the first step to ensure that PWI is not coupled too low, and a strong gate driver is needed to ensure that the gate is not coupled high when PWI is discharged to ground.

The second scheme is illustrated in FIGS. 4(a)–(c) with respect to a recovery from a program step. This scheme is just the reverse of the above scheme, it discharges PWI first, then the gate. A positive potential limiter D5 must therefore be connected to the gate terminal to avoid a strong coupling high via C1 during the first step if a strong driver is used to connect PWI to ground. Similarly, PWI must be connected to ground via a highly conductive path while the gate is discharged to ground to avoid PWI being coupled to −12 volts.

Another scheme that has been utilized is illustrated in FIGS. 5(a)–(b) with respect to a recovery from a program function. In this scheme, both PWI and the gate are discharged to ground at the same time. To implement this, the driving ability to the ground at the gate terminal must be roughly equal to the ground driving ability at PWI to balance the coupling by C1. Otherwise, the clamp circuits D3 and D5 used in the aforementioned schemes are needed to limit voltage swings at the terminals. If equal driving is adapted without the use of a clamp circuit, the precise capacitance estimation of C1, C2, and C3 is crucial to the proper operation of a circuit implementing this scheme. In addition, as C2 and C3 are junction capacitors whose capacitance varies with the potential difference between the two terminals of the capacitors, then C2 and C3 become voltage dependent variables during the recovery period. This variation greatly complicates the precise estimation of C1, C2, and C3 that is needed to implement this scheme.

FIGS. 3, 4, and 5 were discussed above with respect to recovery from a program function. Each of the above three recovery schemes could be applied to a recovery from an erase function as well—only the polarities of the voltages would change. Similarly, the problems discussed above with respect to the program function recovery apply equally with respect to an erase function recovery.

In summary, it has been found that currently utilized schemes to recover the terminals of a triple well floating gate cell after a program or erase function are somewhat limited. In particular, these schemes are limited in the speed at which they can perform the recovery function. This speed limitation is caused by the problems inherent in parasitic coupling between the various nodes of a triple well floating gate cell that has been programmed/erased. Accordingly, it is desirable to provide a scheme to recover a triple well floating gate cell from a program and/or erase function which overcomes the problems of the prior art as set forth above. Further, it is desirable to provide a circuit which will implement such a scheme, and that is capable of being implemented on an integrated circuit with a flash memory cell.

SUMMARY OF THE INVENTION

As discussed above, after a program or erase process has been performed on a floating gate memory cell, the voltage potentials at the nodes of the cell, including the control gate and the channel well, must be recovered to some reference potential such as ground in order to ready the cell for further operations such as a read operation. The present invention provides a recovery circuit and method that performs this recovery operation. Further, the recovery circuit and method of the present invention are implemented in a manner which overcomes the problem of parasitic capacitance coupling between the nodes of a floating gate memory cell inherent in previous methods of recovery. Thus, the recovery circuit and method of the present invention enhance floating gate memory cell program and erase operations by increasing the speed at which they can be performed. The recovery circuit and method are especially useful for the recovery of floating gate memory cells used in non-volatile integrated circuit memory arrays, such as a flash EEPROM. Accordingly the recovery circuit and method of the present invention are especially suited for use in computer systems such as, for instance, those found in portable laptop computers.

The recovery circuit of one embodiment of the present invention recovers the voltage at the control gate of a floating gate memory cell from a first program/erase potential to a first recovery potential and recovers the voltage at the channel well of the cell from a second program/erase potential to a second recovery potential. The floating gate memory cell includes the control gate, a floating gate, the channel well having a first conductivity type that is either p-type or n-type, and drain and source regions within the channel well having a second conductivity type that is different than the first conductivity type.

The recovery circuit of this embodiment includes control circuitry that provides a recovery control signal indicating when a program or erase process has been completed, and a coupling circuit that completes a current path between the control gate and the channel well in response to the recovery control signal. The recovery circuit further includes a first voltage detector circuit that responds to the recovery control signal and that provides a first grounding signal when the recovery voltage potential at the control gate approximately equals a first switching potential, and a second voltage detector circuit that responds to the recovery control signal and that provides a second grounding signal when the recovery voltage potential at the channel well approximately equals a second switching potential. A first voltage grounding circuit that responds to the first grounding signal provides an electrical path between the channel well and a first reference node which is at the second recovery potential, and a second voltage grounding circuit that responds to the second grounding signal provides an electrical path between the control gate and a second reference node which is at the first recovery potential are also included in this embodiment of the recovery circuit.

Further, in a preferred embodiment of the recovery circuit, the recovery circuit is applied to a floating gate memory cell that is a triple well floating gate memory cell. In this embodiment, the floating gate memory cell is in a semiconductor substrate having the first conductivity type, and includes an isolation well having the second conductivity type wherein the channel well is within the isolation well.

Alternatively, the present invention can be characterized as a method for recovering the voltage at the control gate of a floating gate memory cell from a first program/erase potential to a first recovery potential and recovering the voltage at the channel well of the cell from a second program/erase potential to a second recovery potential. The floating gate memory cell includes the control gate, a floating gate, the channel well having a first conductivity type that is either p-type or n-type, and drain and source regions within the channel well having a second conductivity type that is different than the first conductivity type.

The method of this embodiment includes completing a current path between the control gate and the channel well, generating a first grounding signal when the voltage potential at the control gate approximately equals a first switching potential, and generating a second grounding signal when the voltage potential at the channel well approximately equals a second switching potential. The method further includes providing an electrical path between the channel well and a first reference node in response to the first grounding signal, wherein the first reference node is at the second recovery potential, and providing an electrical path between the control gate and a second reference node in response to the second grounding signal, wherein the second reference node is at the first recovery potential.

In a preferred embodiment of the above method, the method of recovery is applied to a floating gate memory cell that is a triple well floating gate memory cell. In this embodiment, the floating gate memory cell is in a semiconductor substrate having the first conductivity type, and includes an isolation well having the second conductivity type wherein the channel well is within the isolation well.

The present invention can also be characterized as an operating method for a triple well floating gate memory cell. The triple well cell includes a drain, a source, a floating gate and a control gate on a semiconductor substrate having a first conductivity type. The substrate includes an isolation well having a second conductivity type different from the substrate, a channel well within the isolation well having the first conductivity type, and source and drain regions for the cell having the second conductivity type within the channel well.

The operating method of this embodiment includes inducing tunneling current between the floating gate and the channel well by applying a first program/erase potential to the control gate, a second program/erase potential to the channel well, a third program/erase potential to the isolation well and a fourth program/erase potential to the substrate. The first and second program/erase potentials are applied such that they establish an electric field between the control gate and the channel well sufficient to induce tunneling current. The third potential is set so that current between the channel well and the isolation well is blocked, and the fourth potential is set so that current between the isolation well and substrate is blocked. The operating method further includes recovering the first program/erase potential to a first recovery potential and the second program/erase potential to a second recovery potential. The step of recovering further includes completing a current path between the control gate and the channel well, generating a first grounding signal when the voltage potential at the control gate approximately equals a first switching potential, and generating a second grounding signal when the voltage potential at the channel well approximately equals a second switching potential. The step of recovering further includes providing an electrical path between the channel well and a first reference node in response to the first grounding signal, wherein the first reference node is at the second recovery potential, and providing an electrical path between the control gate and a second reference node in response to the second grounding signal, wherein the second reference node is at the first recovery potential.

In one instance of the previous embodiments, the first switching potential is a positive voltage and the second switching potential is a negative voltage, and in a particular preferred embodiment the first switching potential is approximately +3 volts and the second switching potential is approximately −2 volts. Alternatively, the first switching potential can be a negative voltage and the second switching potential a positive voltage, and in particular may be −2 volts and +3 volts respectively in another preferred embodiment. In still another preferred embodiment both the first and second reference nodes are coupled to each other and to a ground potential.

In another instance of the previous embodiments, the first program/erase potential is a positive voltage, and the second program/erase potential is a negative voltage. The floating gate memory cell of this embodiment may be further characterized as including an external reference supply applying a ground potential and a positive supply potential. In a preferred instance of this embodiment, the supply potential is specified at 5 volts or less.

In still another instance of the previous embodiments, the first program/erase potential is a negative voltage, and the second program/erase potential is a positive voltage. The floating gate memory cell of this embodiment may be further characterized as including an external reference supply applying a ground potential and a positive supply potential, wherein the magnitude of the second program/erase potential is higher than the supply potential. In a preferred embodiment, the second program/erase potential has a magnitude in a range from near the supply voltage level to positive 14 volts, and the first program/erase potential has a magnitude in a range from negative 4 to negative 10 volts. In still another preferred embodiment, the supply voltage is specified at 5 volts or less.

Accordingly, a recovery circuit and method for recovering a floating gate memory cell, including a triple well floating gate memory cell, from the voltage levels of a completed Fowler-Nordheim tunneling program and/or erase process has been provided. The recovery circuit and method are especially useful for the recovery of floating gate memory cells used in non-volatile integrated circuit memory arrays, such as a flash EEPROM. Accordingly they are especially suited for use in computer systems such as, for instance, those found in portable laptop computers. By utilizing the method or recovery circuit of the present invention the prior art speed problems caused by parasitic coupling between cell nodes are avoided, and overall program and erase process speeds are able to be increased.

Other aspects and advantages of the present invention can be seen upon review of the figures, the detailed description and the claims which follow.

DETAILED DESCRIPTION

Figure 6:
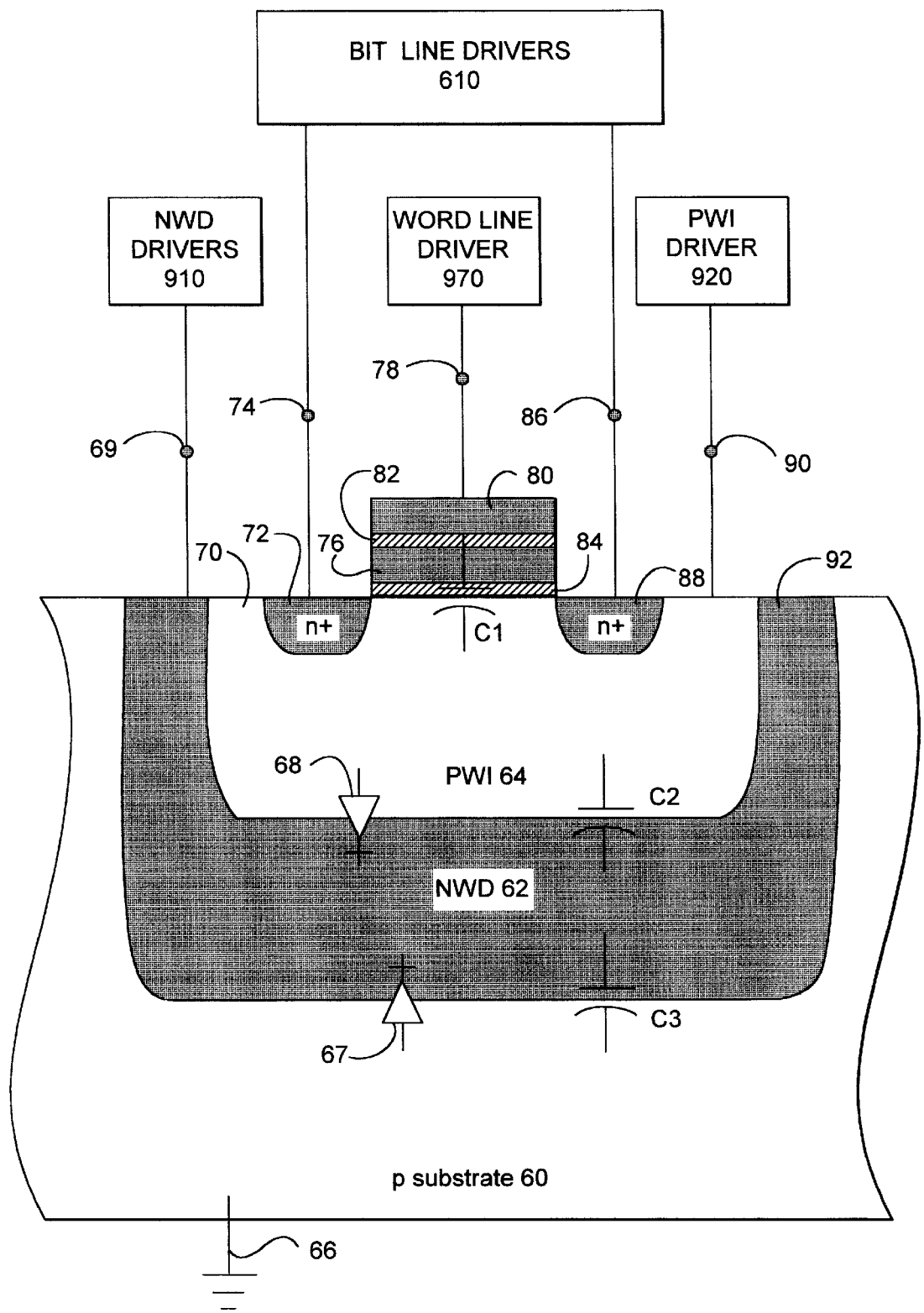
FIG. 6 is a cross section of a triple well flash memory cell configured to utilize one embodiment of the recovery scheme of the present invention.

A detailed description of preferred embodiments of the present invention is provided with respect to the figures, in which FIG. 6 illustrates the basic structure of a triple well floating gate memory cell configured to utilize one embodiment of the recovery scheme of the present invention. As shown in FIG. 6, a semiconductor substrate 60 has a first conductivity type. Preferably, the substrate 60 is silicon with a p-type doping. A deep n-type well NWD 62 is formed in the substrate 60. Inside the deep n-type well 62, a p-type well PWI 64 is included. An n-type source 72 and an n-type drain 88 are included inside the p-type well 64. A floating gate structure, including a floating gate 76 and a tunnel insulator 84, is formed over a channel area between the source 72 and drain 88. A control gate structure, including a control gate 80 and insulator 82, is formed over the floating gate 76. The deep n-type well 62 acts as an isolation well for the device. The p-type well 64 provides a channel region for the cell. The n-type source and drain structures are formed within the p-type well 64, establishing a channel in the p-type well isolated from the substrate 60 by the isolation well 62. The p-substrate 60 is coupled to a ground node 66 in the embodiment shown.

Also shown in FIG. 6 are diode symbols 68 and 67, representing respectively the P-N junction between the channel well PWI 64 and the isolation well NWD 62, and the P-N junction between the substrate 60 and the isolation well NWD 62. As long as the substrate 60 is biased at a level near or less than the isolation well 62, the P-N junction represented by diode symbol 67 is non-conducting. Also, as long as the channel well 64 is biased near or below the isolation well 62, the P-N junction represented by diode symbol 68 is non-conducting. Further illustrated in FIG. 6 is the parasitic capacitance that is formed between the various nodes of the floating gate cell. These capacitances are illustrated as C1 (the gate to PWI capacitor), C2 (the PWI to NWD junction capacitor), and C3 (the NWD to P-substrate junction capacitor).

Figure 1:
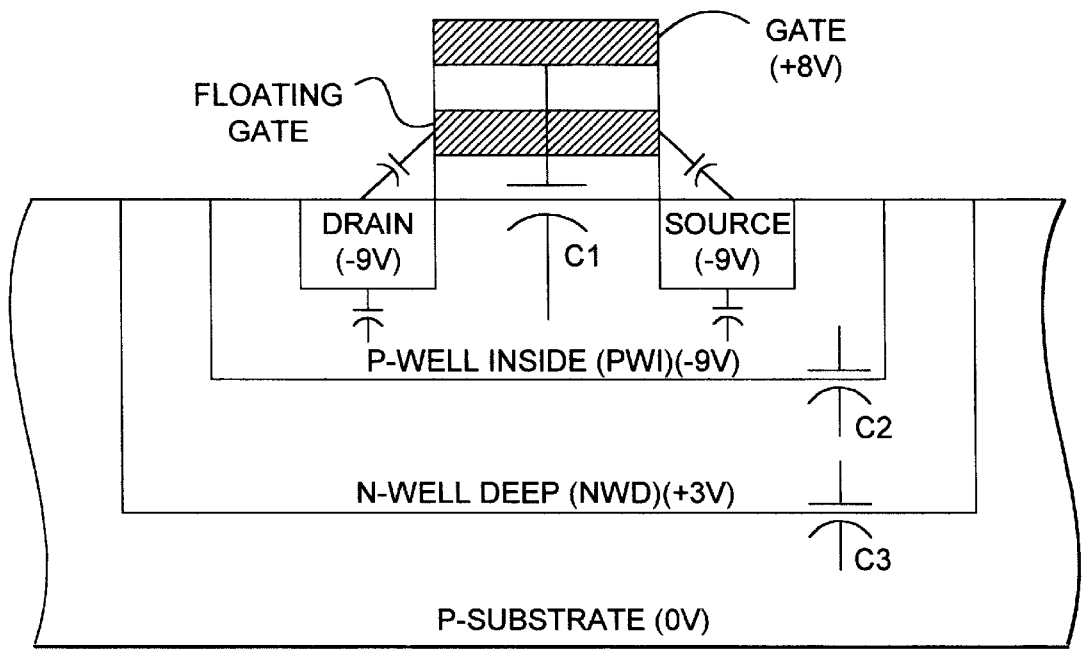
FIG. 1 is a cross section of a triple well flash memory cell which illustrates the typical voltages applied to the various cell nodes during a typical program function.
Figure 2:
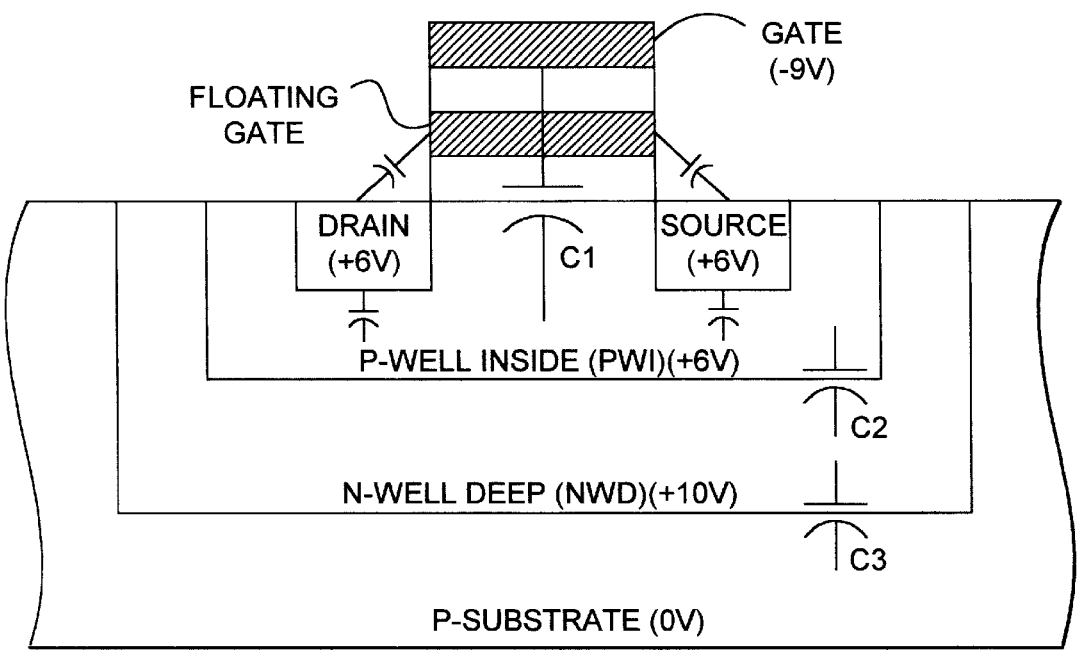
FIG. 2 is a cross section of a triple well flash memory cell which illustrates the typical voltages applied to the various cell nodes during a typical erase function.

Also illustrated in FIG. 6 are the NWD Driver 910, the Bit Line Driver 610, the Word Line Driver 970, and the PWI Driver 920 which are supplied to provide biasing to the NWD 62, source 72 and drain 88, control gate 80, and PWI 64 respectively in accordance with one embodiment of the recovery scheme of the present invention. The NWD Driver 910 is coupled to the NWD 62 through bias point 69. The source 72 and the drain 88 are coupled to the Bit Line Driver 610 through contact points 74 and 86 respectively. The control gate 80 is coupled to the Word Line Driver 970 through bias point 78. The PWI 64 is coupled to the PWI Driver 920 through bias point 90. The NWD Driver 910, the Bit Line Driver 610, the Word Line Driver 970, and the PWI Driver 920 provide the biasing needed at these terminals to achieve cell recovery from a typical triple well cell program/erase. The mechanism and circuitry utilized to provide this biasing is described more fully below with respect to FIGS. 7–8 and FIGS. 9–13 respectively. The voltages used in a typical program/erase of a triple well floating gate memory cell were discussed previously with respect to FIGS. 1 and 2, and are summarized below in Table I.

TABLE 1

| | Voltages for Typical Program/Erase | | | | | |
|---|---|---|---|---|---|---|
| | Gate | Drain | Source | PWI | NWD | Substrate |
| Program | +8 V | −9 V | −9 V | −9 V | +3 V | 0 V |
| Erase | −9 V | +6 V | +6 V | +6 V | +10 V | 0 V |

The example voltages set forth in the table are representative voltages, and will vary from embodiment to embodiment depending on such factors as gate coupling ratio of the memory cell, speed of operation requirements, and supply current available. The high positive voltages and negative voltages are typically generated by charge pumps on the integrated circuit, so that negative levels and levels higher than the VDD supply voltage which is applied to the chip by an external source, can be achieved. The VDD supply voltage therefore is not constrained to high values, and may be for example as low as two volts or lower.

The concept of the cell recovery scheme of the present invention to be described below can be described with respect to the effect of electrically connecting together the two terminals of a capacitor. For, when the two terminals are thus connected, any positive and negative charge stored on the capacitor will be neutralized and the coupling phenomena discussed above with respect to FIGS. 1 and 2 will not occur.

Thus, one embodiment of the recovery scheme of the present invention is illustrated in FIGS. 7(a)–(b) and 8(a)–(b), in which FIG. 7(a)–(b) is a simplified block diagram illustrating the recovery scheme as applied to a program function recovery, and FIG. 8(a)–(b) is a simplified block diagram illustrating the recovery scheme as applied to an erase function recovery.

FIG. 7(a) illustrates the approximate relative voltage levels present at the control gate 80, the PWI 64, the NWD 62, and p-substrate 60 after a typical program function is performed on a triple well floating gate memory cell. As shown, the gate is at +8 volts, the PWI at −9 volts, the NWD at +3 volts, and the p-substrate is at ground (0 V). FIG. 7(b) illustrates the recovery of the cell from this program condition according to one embodiment of the invention. As shown previously with respect to FIG. 6, the voltage at the control gate 80 is provided at bias point 78, the voltage at the PWI 64 is provided at bias point 90, and the voltage at the NWD 62 is provided at bias point 69. The coupling of these voltages is illustrated by parasitic capacitances C1, C2, and C3 in which C1 is the gate to PWI capacitor, C2 is the PWI to NWD junction capacitor, and C3 is the NWD to P-substrate junction capacitor. Bias point 78 is connected to node 702 which is in turn coupled to line 715—line 715 is further coupled to ground through switch SW2. Bias point 90 is coupled to node 704 which is in turn coupled to line 725—line 725 is further coupled to ground through switch SW3. Node 702 is further coupled to node 704 through switch SW1 which is normally in an open condition. Positive voltage detector 710 is coupled to line 715 and operates to close switch SW3 upon detecting a predetermined voltage on line 715, which in one embodiment is approximately 3 volts. Negative voltage detector 720 is coupled to line 725 and operates to close switch SW2 upon detecting a predetermined voltage on line 725, which in one embodiment is approximately −2 volts. Bias point 69 is coupled to an input end of switch SW7, and the output end of switch SW7 is coupled to clamping diode D7 which is used to limit any voltage transient on the NWD to approximately <=+5 volts in one embodiment of the invention.

Figure 7:
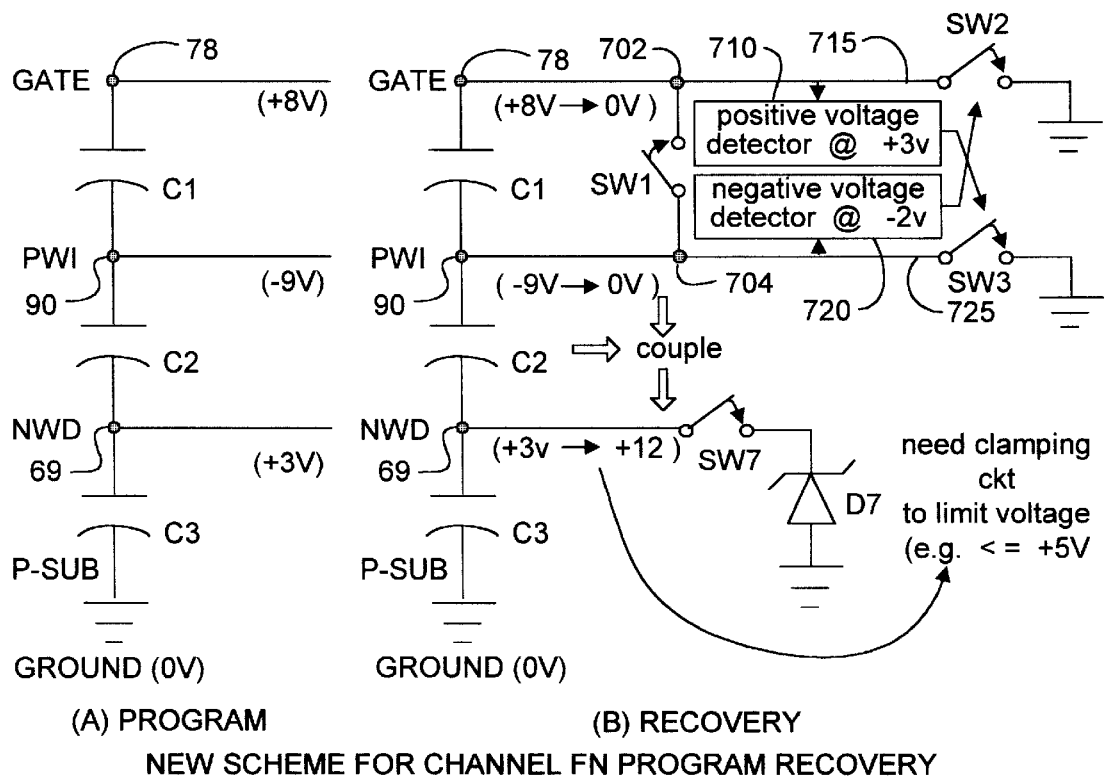
FIGS. 7(a)–(b) illustrate, in simplified block diagram form, a program function recovery scheme according to one embodiment of the present invention.

The first step of the recovery of a cell in accordance with the scheme illustrated in FIG. 7 is the shorting together of the two terminals of C1. Thus, at the beginning of the recovery step, the switch SW1 closes thereby coupling nodes 702 and 704, and coupling the control gate 80 with the PWI 64. This causes the voltage potential at the control gate 80 to fall, and the voltage potential at the PWI 64 to rise. Because of the different initial potentials of the control gate 80 and the PWI 64, and further because of the existence of parasitic capacitances C2 and C3, simply connecting the two terminals of C1 would not recover the control gate 80 and the PWI 64 to ground potential. The second step of the recovery scheme occurs after SW1 has been closed, and involves detecting the voltages on lines 715 and 725, and selectively providing for grounding paths. For, after SW1 is closed, when the voltage on the control gate 80, and thus on the line 715, is low enough (approximately 3 volts in one embodiment), the positive voltage detector 710 outputs a signal to close switch SW3 thereby enabling a PWI grounding path. Similarly, after SW1 is closed, when the voltage on the PWI 64, and thus on line 725, is high enough (approximately −2 volts in one embodiment), the negative voltage detector 720 outputs a signal to close switch SW2 thereby enabling a control gate grounding path.

Figure 3:
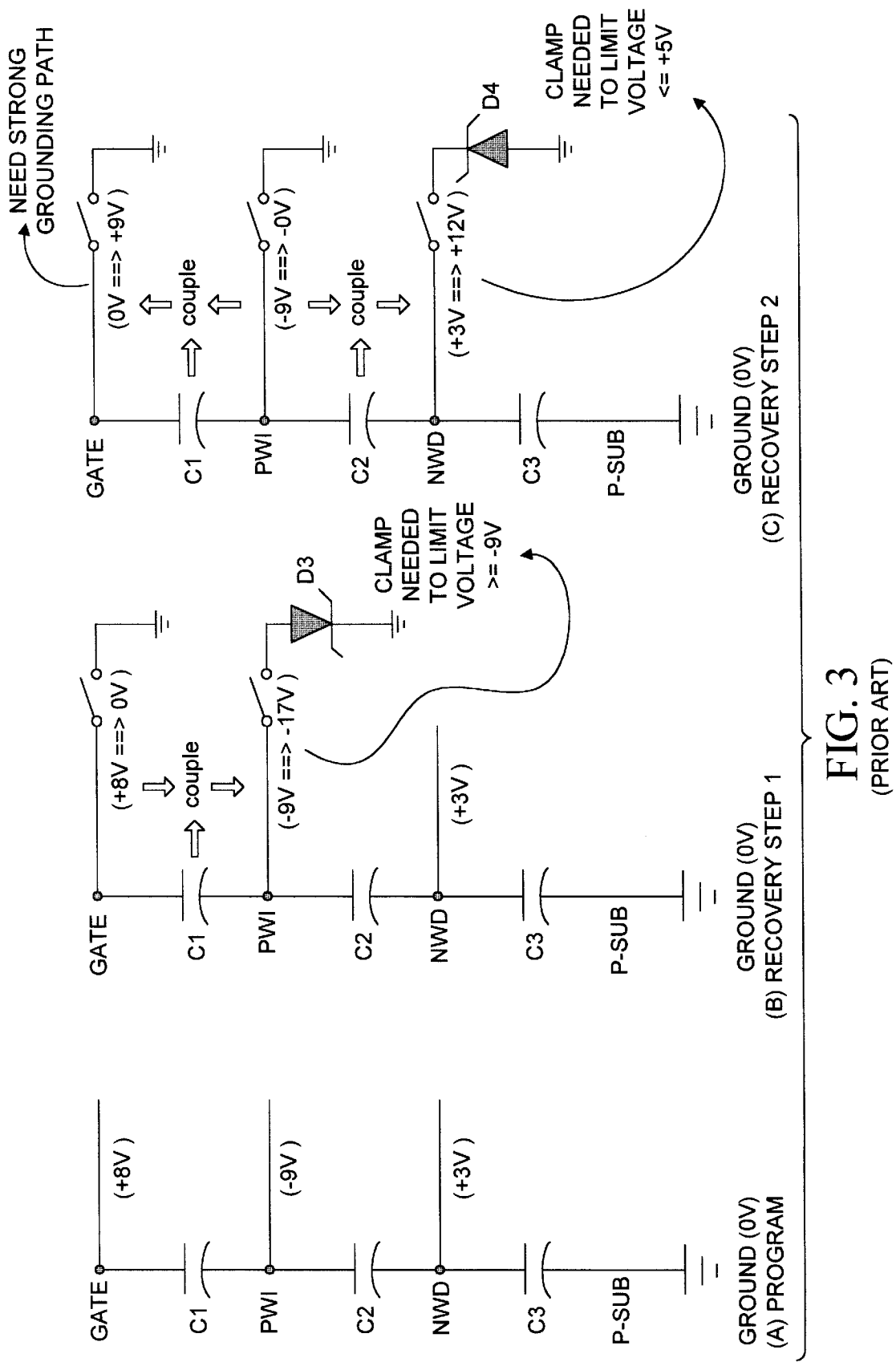
FIGS. 3(a)–(c) illustrate a known recovery scheme from a typical program function of a flash memory cell.
Figure 4:
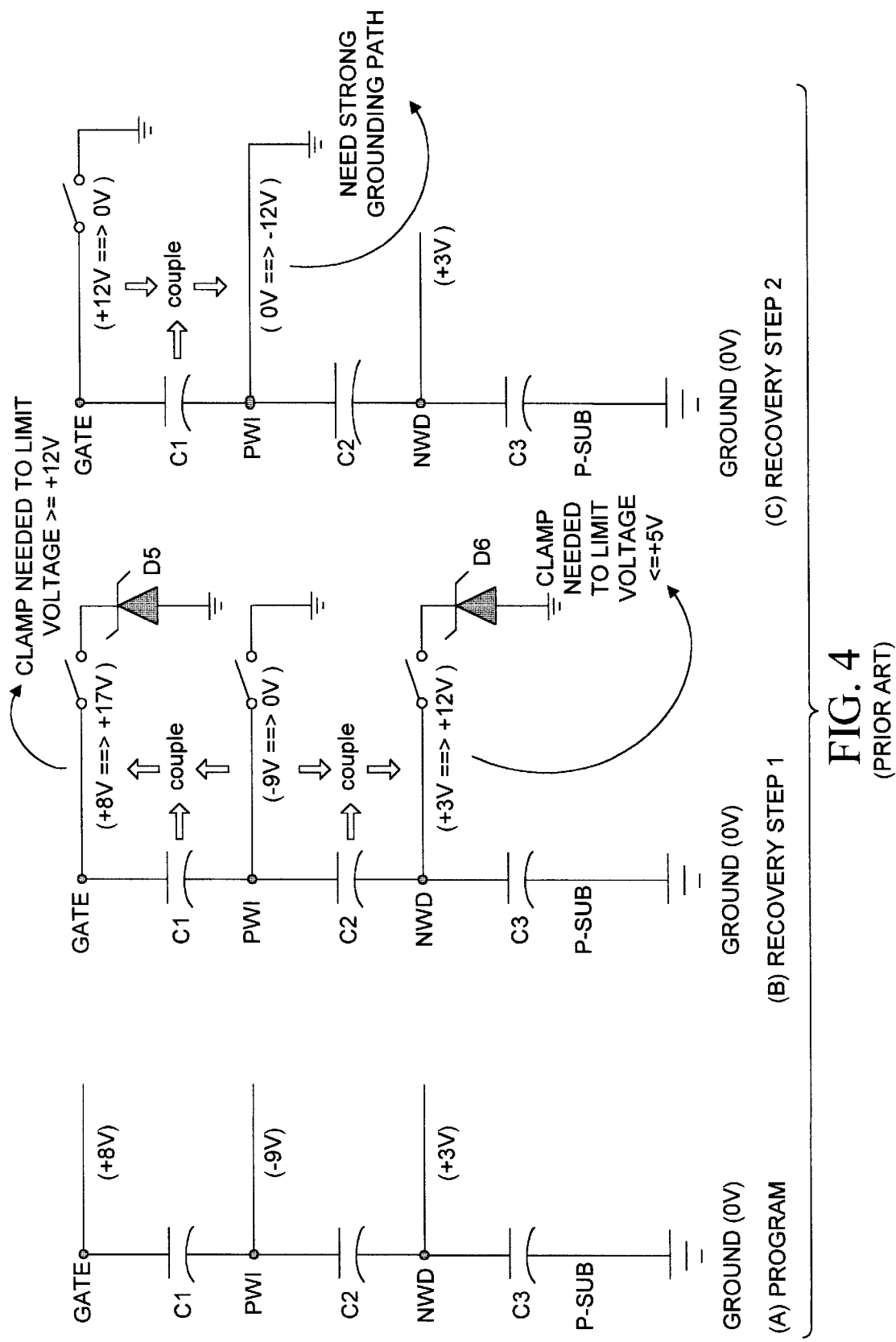
FIGS. 4(a)–(c) illustrate a further known recovery scheme from a typical program function of a flash memory cell.
Figure 5:
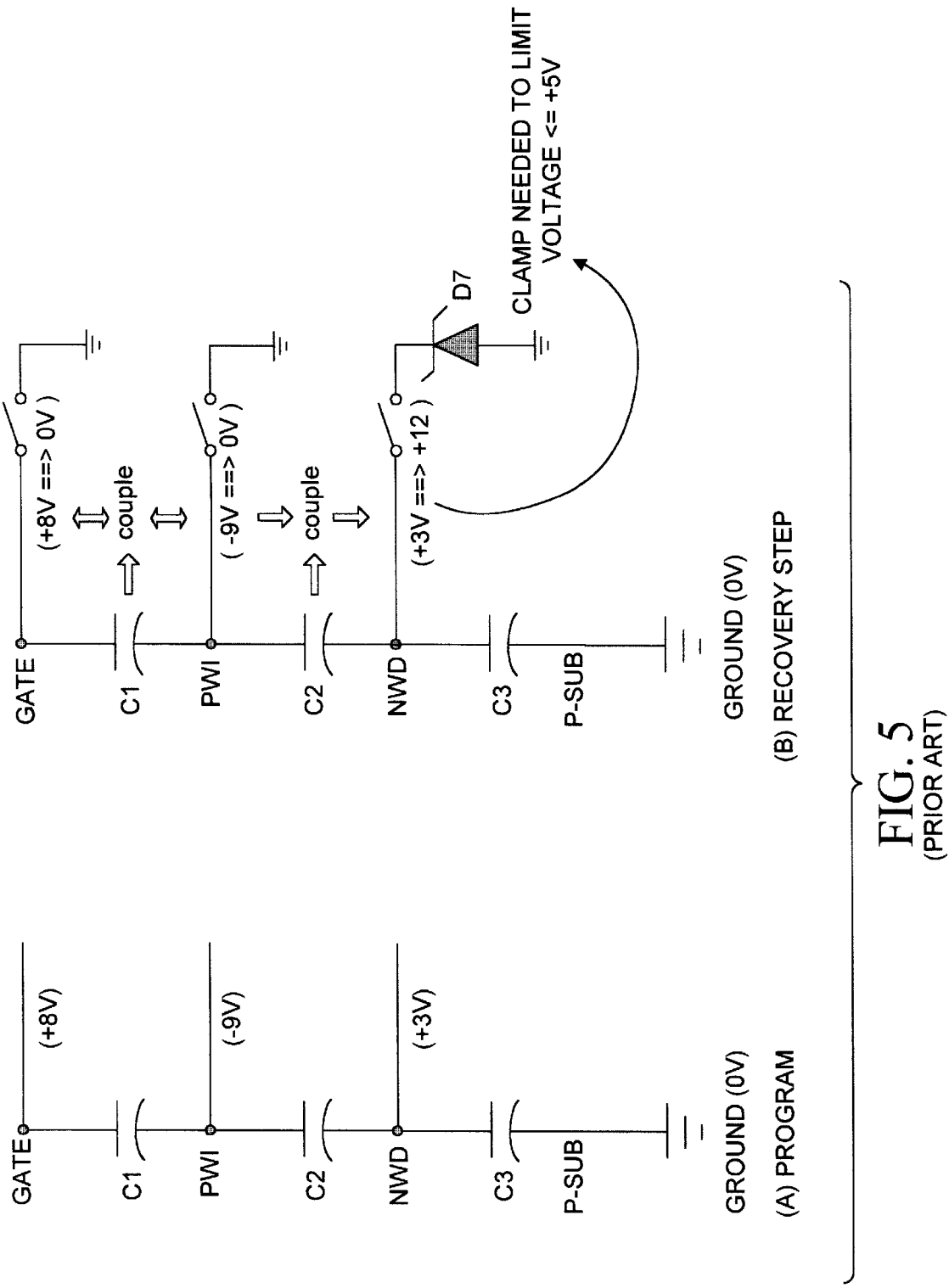
FIGS. 5(a)–(b) illustrate a still further known recovery scheme from a typical program function of a flash memory cell.

Thus, by properly choosing the triggering voltages of detectors 710 and 720, one can avoid the coupling problems discussed above with respect to the prior art schemes depicted in FIGS. 3–5, and accordingly provide a faster and simpler recovery scheme. Note that with this scheme, no complex estimation of the relative values of the capacitances C1, C2, and C3 is needed. Further, only a single grounding path is needed for each of the control gate 80, and the PWI 64. Lastly, no clamping circuit is needed on the nodes connected to the control gate 80 or the PWI 64 in order to limit voltage transients on these nodes. As shown in FIG. 7(b), note that clamp diode D7 (which limits the voltage at the NWD 62 to <=+5 volts in one embodiment) is used to limit voltage transients at the NWD 62 due to coupling C2 when the PWI 64 is connected to the control gate 80 and when the PWI 64 is discharged to ground. In another embodiment, a scheme similar to the one described above could be used to reduce the coupling effect between the PWI 64 and the NWD 62 via C2.

FIG. 8(a) illustrates the approximate relative voltage levels present at the control gate 80, the PWI 64, the NWD 62, and p-substrate 60 after a typical erase function is performed on a triple well floating gate memory cell. As shown, the gate is at −9 volts, the PWI at +6 volts, the NWD at +10 volts, and the p-substrate is at ground (0 V). FIG. 8(b) illustrates the recovery of the cell from this erase condition according to one embodiment of the invention. As shown previously with respect to FIG. 6, the voltage at the control gate 80 is provided at bias point 78, the voltage at the PWI 64 is provided at bias point 90, and the voltage at the NWD 62 is provided at bias point 69. The coupling of these voltages is illustrated by parasitic capacitances C1, C2, and C3 in which C1 is the gate to PWI capacitor, C2 is the PWI to NWD junction capacitor, and C3 is the NWD to P-substrate junction capacitor. Bias point 78 is connected to node 802 which is in turn coupled to line 815—line 815 is further coupled to ground through switch SW5. Bias point 90 is coupled to node 804 which is in turn coupled to line 825—line 825 is further coupled to ground through switch SW6. Node 802 is further coupled to node 804 through switch SW4 which is normally in an open condition. Negative voltage detector 810 is coupled to line 815 and operates to close switch SW6 upon detecting a predetermined voltage on line 815, which in one embodiment is approximately −2 volts. Positive voltage detector 820 is coupled to line 825 and operates to close switch SW5 upon detecting a predetermined voltage on line 825, which in one embodiment is approximately 3 volts.

Figure 8:
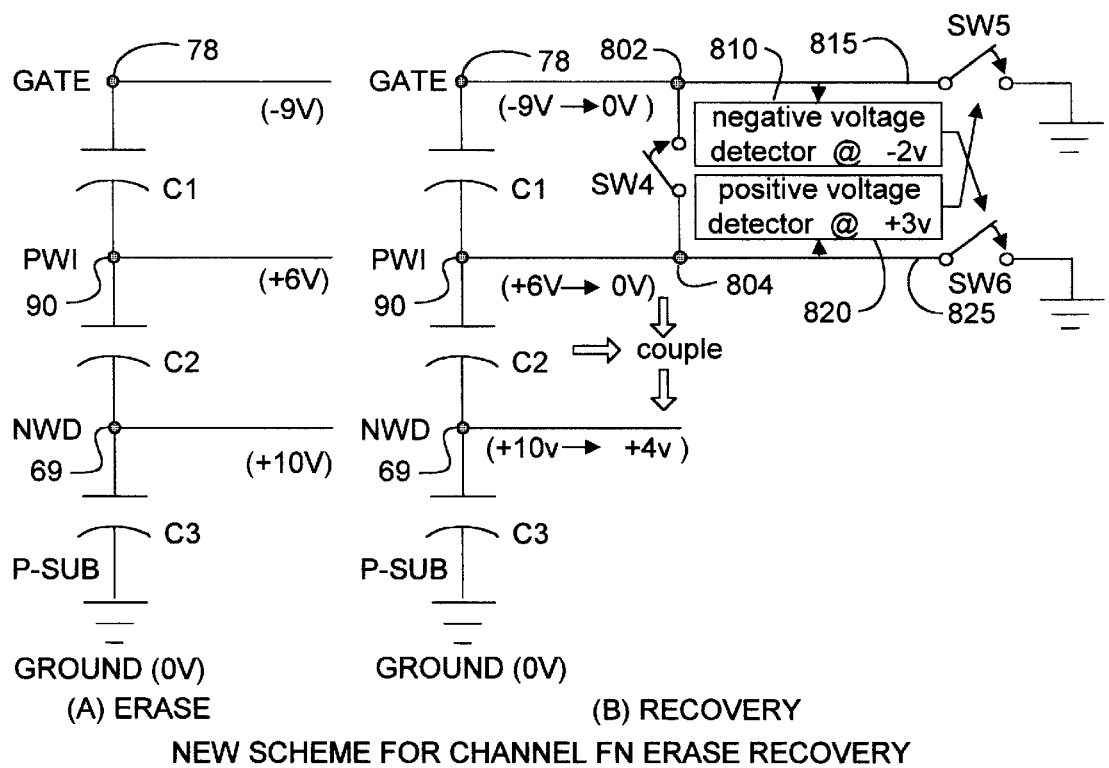
FIGS. 8(a)–(b) illustrate, in simplified block diagram form, an erase function recovery scheme according to one embodiment of the present invention.

The first step of the recovery of a cell from an erase function in accordance with the scheme illustrated in FIG. 8 is the shorting together of the two terminals of C1. Thus, at the beginning of the recovery step, the switch SW4 closes thereby coupling nodes 802 and 804, and coupling the control gate 80 with the PWI 64. This causes the voltage potential at the control gate 80 to rise, and the voltage potential at the PWI 64 to fall. Because of the different initial potentials of the control gate 80 and the PWI 64, and further because of the existence of parasitic capacitances C2 and C3, simply connecting the two terminals of C1 would not recover the control gate 80 and the PWI 64 to ground potential. The second step of the recovery scheme occurs after SW4 has been closed, and involves detecting the voltages on lines 815 and 825, and selectively providing for grounding paths. For, after SW4 is closed, when the voltage on the control gate 80, and thus on the line 815, is high enough (approximately −2 volts in one embodiment), the negative voltage detector 810 outputs a signal to close switch SW6 thereby enabling a PWI grounding path. Similarly, after SW4 is closed, when the voltage on the PWI 64, and thus on line 825, is low enough (approximately +3 volts in one embodiment), the positive voltage detector 820 outputs a signal to close switch SW5 thereby enabling a control gate grounding path.

Thus, by properly choosing the triggering voltages of detectors 810 and 820, one can avoid the coupling problems discussed above with respect to the prior art schemes depicted in FIGS. 3–5, and accordingly provide a faster and simpler recovery scheme. As with the discussion of the program recovery scheme above, no complex estimation of the relative values of the capacitances C1, C2, and C3 is needed for this erase recovery scheme. Further, only a single grounding path is needed for each of the control gate 80, and the PWI 64. Lastly, no clamping circuit is needed on the nodes connected to the control gate 80 or the PWI 64 in order to limit voltage transients on these nodes.

Figure 9:
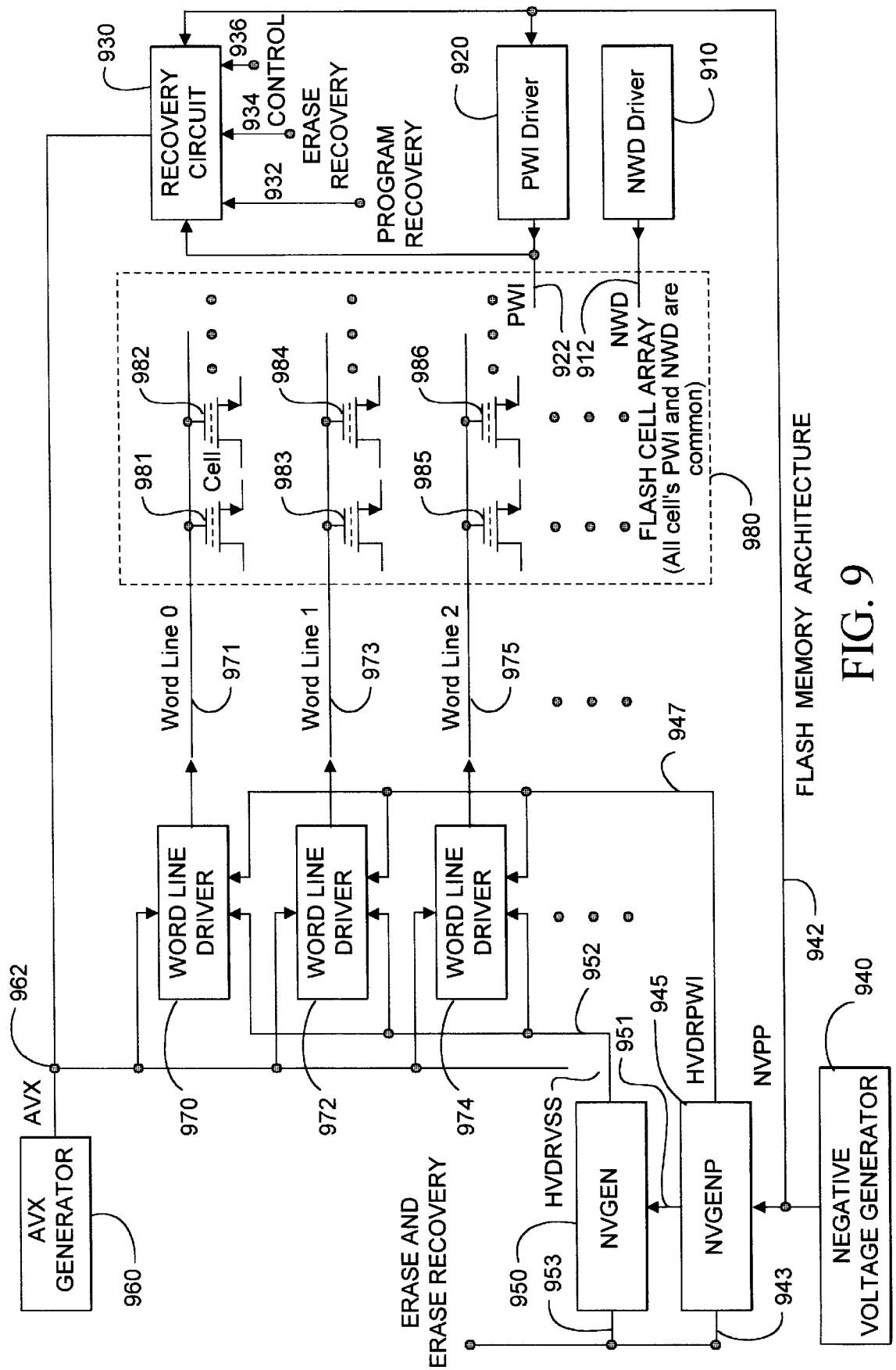
FIG. 9 is a simplified block diagram of a portion of a flash memory integrated circuit architecture according to one embodiment of the present invention.

FIG. 9 illustrates a portion of a flash memory integrated circuit architecture that can be operated using one embodiment of the cell recovery scheme of the present invention. This integrated circuit architecture comprises: a flash cell array 980 which comprises a plurality of triple well floating gate memory cells 981–986, an NWD driver 910, a PWI driver 920, a recovery circuit 930, a negative voltage generator 940, a word line driver substrate bias generator (NVGENP) 945, a word line driver $V_{ss}$ generator (NVGEN) 950, an AVX generator 960, and a plurality of word line drivers 970–974.

The flash cell array 980 is comprised of a number of rows and columns of triple well floating gate memory cells partially shown as cells 981–986. The control gates of cells in the same row of the array 980 are connected together to the output of a single word line driver. For instance, the control gates of cells 981 and 982 are coupled to the output of word line driver 970 through word line 0 on line 971, the control gates of cells 983 and 984 are coupled to the output of word line driver 972 through word line 1 on line 973, and the control gates of cells 985 and 986 are coupled to the output of word line driver 974 through word line 2 on line 975. The AVX generator 960 generates a positive potential AVX and provides this potential on node 962. Node 962 is further coupled to each of the word line drivers 970–974 thus providing the positive potential AVX as the positive power supply for each of the word line drivers 970–974. Node 962 is also coupled to the recovery circuit 930, thereby providing a path for the recovery of the word lines of the array 980 to ground via recovery circuit 930.

Negative voltage generator 940 generates a negative voltage NVPP on node 942, which is in turn coupled to the NVGENP 945, the PWI driver 920, and the recovery circuit 930. The NVGENP 945 receives the NVPP voltage on node 942 as an input and functions to provide a high voltage driver PWI voltage HVDRPWI as an output on lines 947 and 951. The output HVDRPWI consists of a signal equal to either an inhibit supply voltage GND or the value of NVPP, and the NVGENP 945 generates the value of HVDRPWI in response to an Erase & Erase Recovery control signal provided on line 943. The output HVDRPWI is provided to the word line drivers 970–974 via line 947 to function as the bias voltage for the triple well NMOS's substrate bias in the word line drivers 970–974.

The NVGEN 950 receives the output HVDRPWI as an input on line 951 and functions to provide a high voltage driver $V_{ss}$ voltage HVDRVSS as an output on line 952. The output HVDRVSS consists of a signal equal to either the inhibit supply voltage GND or the value of HVDRPWI, and the NVGEN 950 generates the value of HVDRVSS in response to the Erase & Erase Recovery control signal provided on line 953. The output HVDRVSS is provided to the word line drivers 970–974 via line 952 to function as the word line drivers' negative power supply. The NWD driver 910 provides the bias voltage for the NWD 62 of each of the cells 981–986 on line 912. The PWI driver 920 receives the NVPP voltage as an input from node 942 and provides the bias voltage for the PWI 64 of each of the cells 981–986 on node 922. For one embodiment of the flash memory integrated circuit architecture illustrated in FIG. 9, the typical operating bias voltages for the read, program, and erase functions are tabulated below in Table II.

TABLE II

Typical Operating Bias Voltages

|  | AVX | HVD-RVSS | HVD-RPWI | NVPP | Word Line | PWI | NWD |
|---|---|---|---|---|---|---|---|
| Read | Vdd | 0 V | 0 V | 0 V | Vdd/0 V | 0 V | Vdd |
| Program | 8 V | 0 V | 0 V | –9 V | 8 V | –9 V | 3 V |
| Erase | 3 V | –9 V | –9 V | –9 V | –9 V | 6 V | 10 V |

The recovery circuit 930 receives the inputs AVX on node 962, PWI bias voltage on node 922, NVPP on node 942, Program Recovery signal on node 932, Erase Recovery signal on node 934, and Control signal on node 936. The recovery circuit 930 functions to recover the cells 981–986 from the program/erase operating voltages set forth above by implementing the recovery scheme described above with respect to FIGS. 7 and 8. The function of one embodiment of the recovery circuit 930 will be set out in more specific detail below with respect to FIG. 13 which is a detailed schematic of a circuit comprising one embodiment of the recovery circuit 930.

Figure 10:
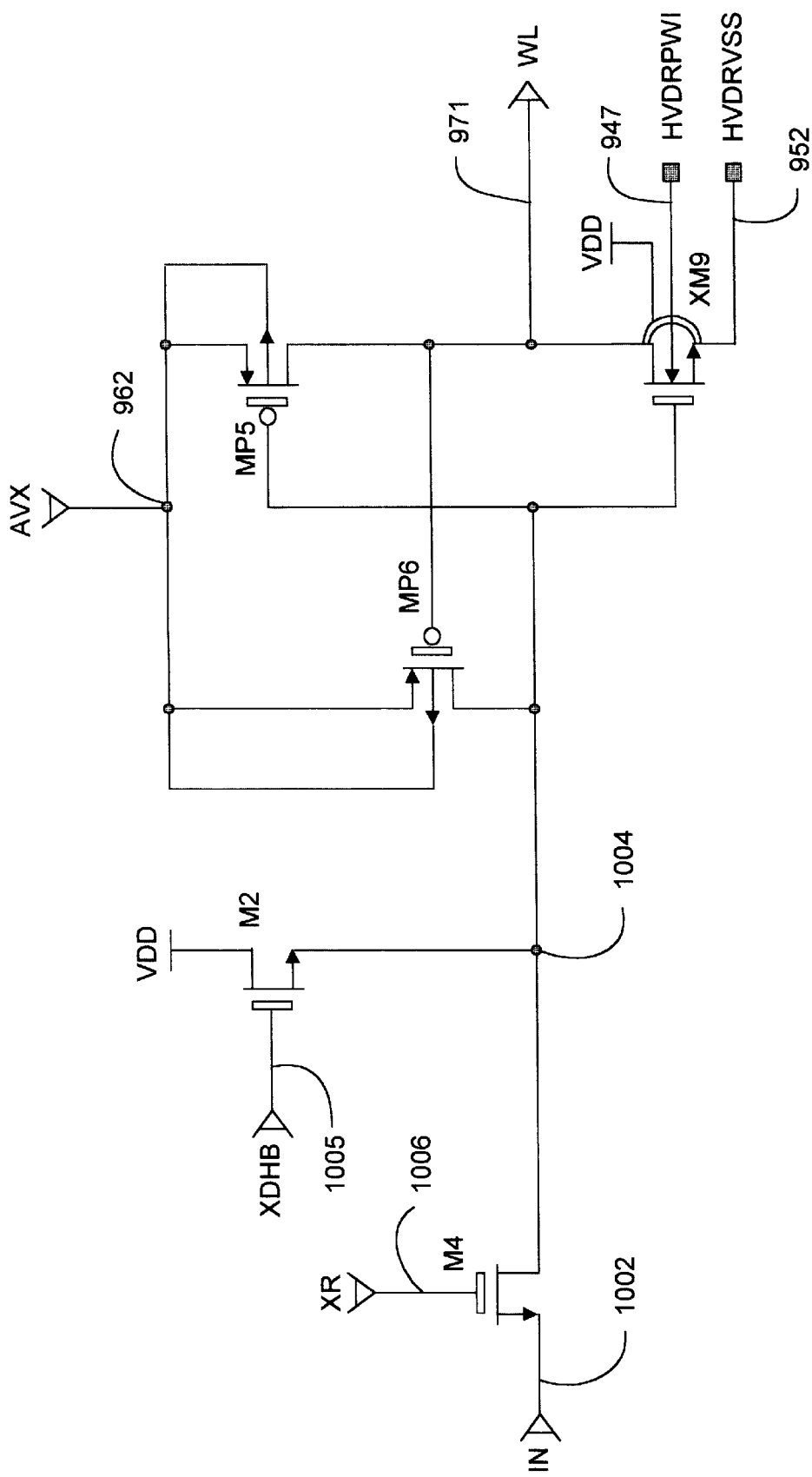
FIG. 10 is a schematic diagram of a word line driver of FIG. 9 according to one embodiment of the present invention.

FIG. 10 is a detailed schematic of one embodiment of the word line drivers 970–974 of FIG. 9. The following discussion of this embodiment will be with respect to the single word line driver 970, but would apply equally to each of the word line drivers of the flash memory integrated circuit of FIG. 9. The word line driver 970 receives the positive potential AVX on node 962 from the AVX generator 960 of FIG. 9, and also receives the high voltage driver $V_{ss}$ voltage HVDRVSS on line 952. The word line driver 970 includes an inverter composed of transistors MP5 and XM9 having their gates coupled to an input at node 1004, and their drains coupled to a word line 971, which functions as the output of the word line driver 970. The word line driver circuit 970 also includes feedback which is provided by p-channel transistor MP6 which has its gate coupled to the word line 971, its drain coupled to the input node 1004, and its source coupled to the AVX input node 962. The n-wells of the p-channel transistors MP5 and MP6 are both coupled to the AVX input node 962. The n-channel transistor XM9 consists of a triple well transistor. The source of transistor XM9 is coupled to input voltage HVDRVSS on line 952, the p-well inside PWI 64 of XM9 is coupled to the voltage HVDRPWI on line 947, and the deep n-well NWD 62 is biased at the supply potential $V_{DD}$ which is typically 5 volts+/–10%. The input voltage HVDRVSS on line 952 is provided by NVGEN 950 in response to the Erase & Erase Recovery control signal on line 953 as described generally above with respect to FIG. 9 and more particularly below with respect to FIG. 11.

The word line driver 970 further includes a "keeper" transistor M2 which consists of an n-channel transistor having its source coupled to the input node 1004, its drain coupled to the supply terminal $V_{DD}$, and its gate coupled to a control signal XDHB on line 1005. This control signal XDHB on line 1005 is controlled during the erase mode such that the control signal XDHB is switched from $V_{DD}$ to 0 volts in order to break the connection between AVX on node 962 and the supply voltage $V_{DD}$. An n-channel transistor M4 is connected in a pass-gate configuration between the input node 1004 and a decode logic input node 1002. The n-channel transistor M4 has its gate coupled to the signal XR on line 1006 which is supplied by a word line decode logic which is not shown. The source of transistor M4 is connected to a decode logic input signal IN at node 1002. The IN signal in combination with the signal XR on line 1006 serves to identify the particular word line driver circuit 970 being operated upon by the flash memory integrated circuit.

Accordingly, the word line driver 970 operates during the read and program mode to apply a positive voltage or ground at word line 971 as a result of the specific word line circuit 970 being acted upon by the word line decode logic. During erase, a negative voltage or ground is applied to the word line 971 through the triple well n-channel transistor XM9.

Figure 11:
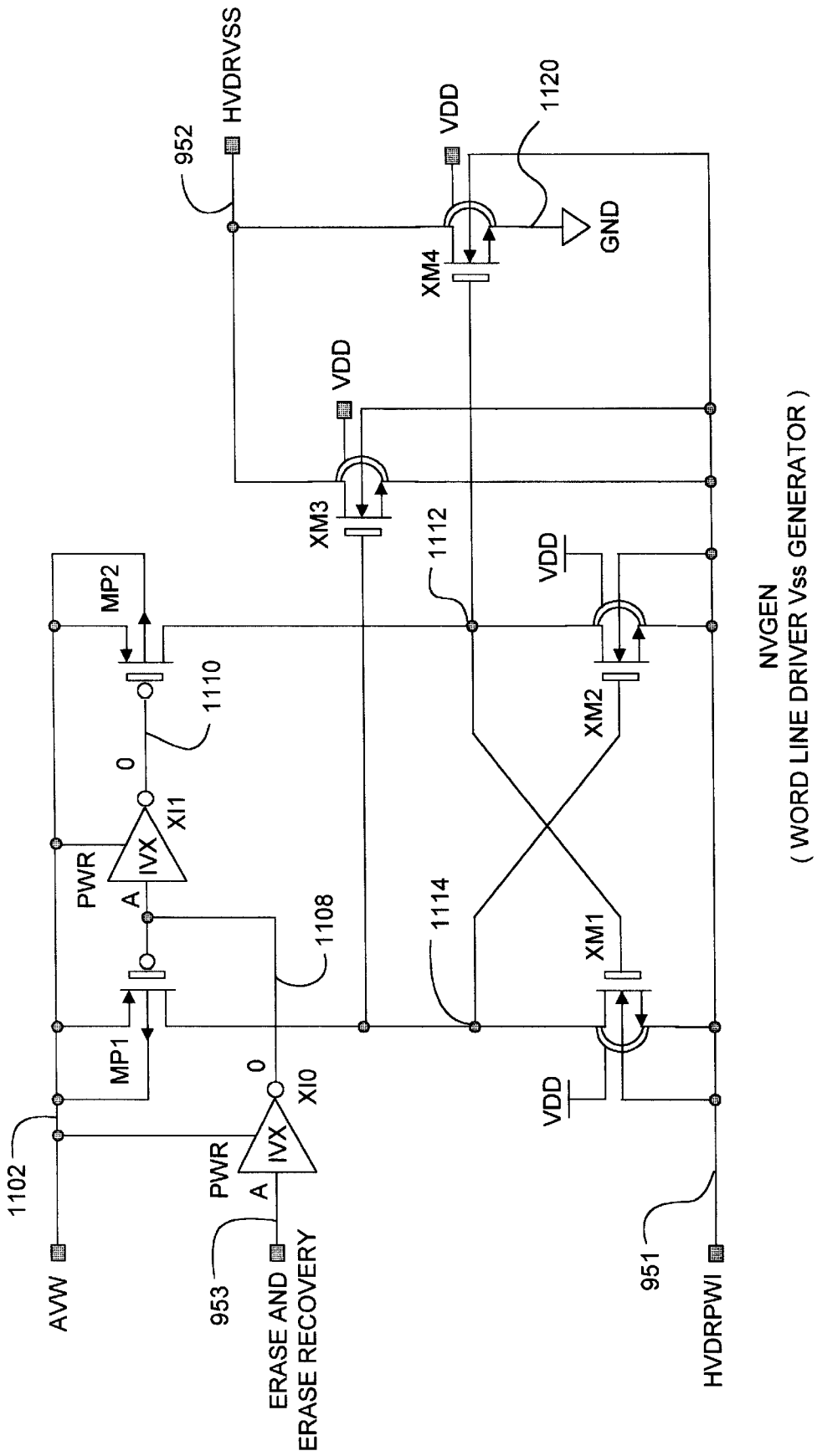
FIG. 11 is a schematic diagram of the word line driver $V_{ss}$ generator of FIG. 9 according to one embodiment of the present invention.

FIG. 11 illustrates one embodiment of the word line driver $V_{ss}$ generator NVGEN 950 of FIG. 9 in detailed schematic form. The NVGEN 950 receives a supply input voltage AVW on line 1102, an Erase and Erase Recovery signal on line 953, voltage HVDRPWI on line 951, and a ground voltage GND on line 1120. The voltage HVDRPWI on line 951 is provided by the NVGENP 945 which will be described more fully below with respect to FIG. 12. The NVGEN 950 circuit operates to select between the voltage HVDRPWI and the ground voltage GND for supply of the voltage HVDRVSS on an output line 952 which corresponds to the signal HVDRVSS on line 952 of FIGS. 9 and 10.

The NVGEN 950 includes p-channel MOS transistor MP1 which has its source and n-well coupled to the supply line 1102, its drain coupled to node 1114, and its gate coupled to line 1108. The Erase and Erase Recovery signal on line 953 is provided as the input to an inverter XI0, and the output of inverter XI0 is coupled to line 1108. P-channel MOS transistor MP2 has its source and n-well coupled to node 1102, its gate connected to the output of an inverter XI1 which has its input connected to node 1108. The drain of transistor MP2 is connected to node 1112. A triple well n-channel MOS transistor XM1 has its gate connected to node 1112, its drain connected to node 1114, and its source and p-well PWI connected to line 951 at which voltage HVDRPWI is provided. The deep n-well NWD of transistor XM1 is coupled to the supply terminal $V_{DD}$. Triple well transistor XM2 has its drain coupled to node 1112, its gate coupled to node 1114, and its source and p-well coupled to line 951. The deep n-well of transistor XM2 is coupled to the supply terminal $V_{DD}$.

A triple well n-channel MOS transistor XM3 has its gate connected to node 1114, its drain connected to line 952, and its source and p-well PWI connected to line 951 at which voltage HVDRPWI is provided. The deep n-well NWD of transistor XM3 is coupled to the supply terminal $V_{DD}$. A triple well n-channel MOS transistor XM4 has its gate connected to node 1112, its drain connected to line 952, its source connected to line 1120 at which ground voltage GND is provided, and p-well PWI is connected to line 951 at which voltage HVDRPWI is provided. The deep n-well NWD of transistor XM4 is coupled to the supply terminal $V_{DD}$.

In operation, when the Erase and Erase Recovery signal on line 953 is high, the output of inverter XI0 on line 1108 is low. When the signal on line 1108 is low, transistor MP1 is turned on and transistor MP2 is turned off. This drives the voltage at node 1114 to the level of the supply input voltage AVW on line 1102 (typically 3 volts) thereby turning on transistors XM2 and XM3. Node 1112 is thereby driven to the voltage HVDRPWI via transistor XM2, which in turn assures that transistors XM41 and XM4 are turned off. This voltage HVDRPWI is thus applied to output line 952 through transistor XM3 while transistor XM4 is turned off. Transistor XM4 serves to isolate the negative voltage at line 952 from the ground potential on node 1120.

When the Erase and Erase Recovery signal on line 953 is low, the output of inverter XI0 on line 1108 is high. When the signal on line 1108 is high, transistor MP1 is turned off and transistor MP2 is turned on. This drives the voltage at node 1112 to the value of AVW thereby turning on transistors XM1 and XM4. Node 1114 is thereby driven to the voltage HVDRPWI via transistor XM1, which in turn assures that transistors XM2 and XM3 are turned off. Therefore, the ground voltage GND on line 1120 is provided to the output line 952 through transistor XM4. Transistor XM3 serves to isolate the ground voltage at line 952 from the typically negative potential at line 951.

Figure 12:
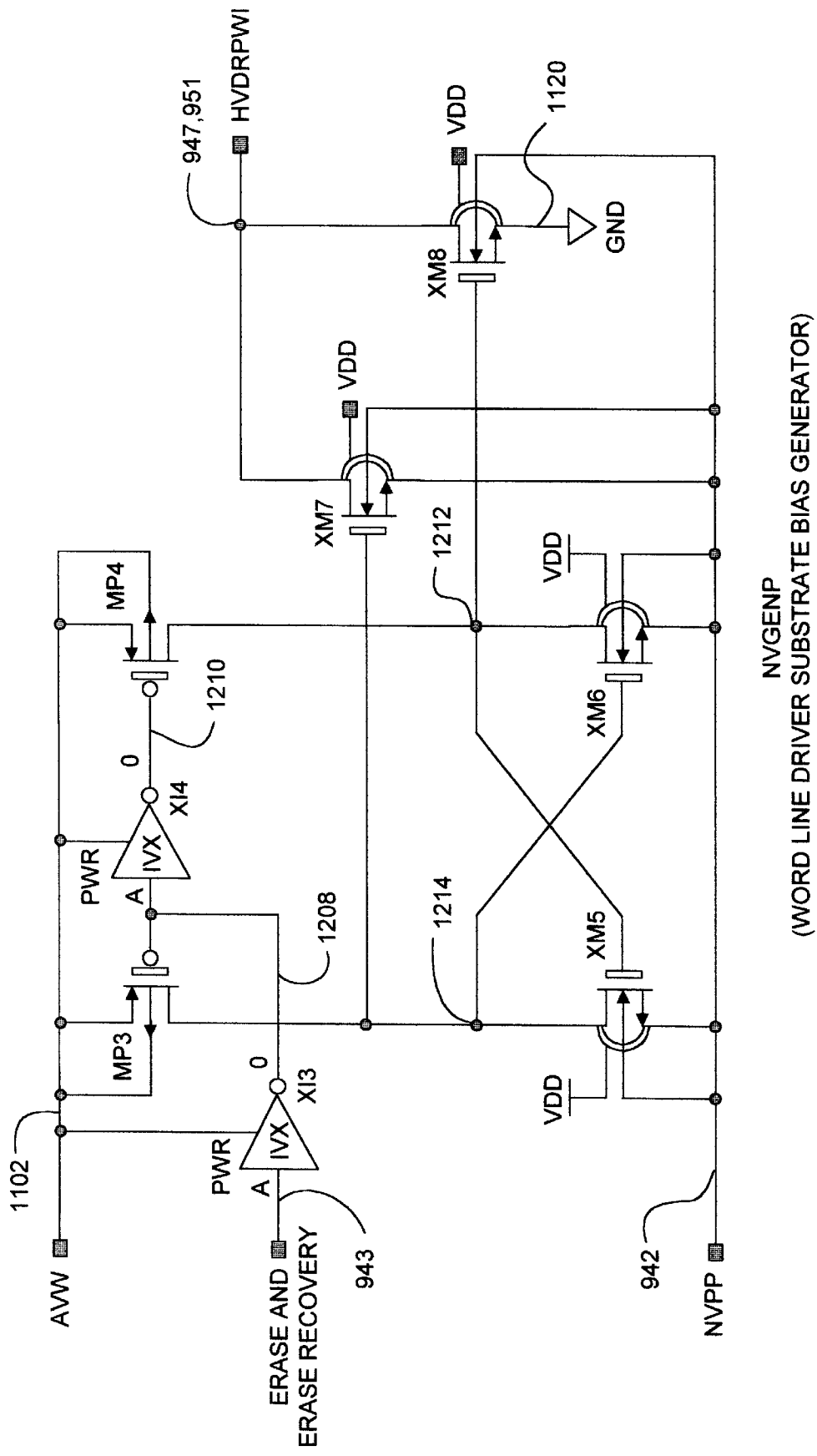
FIG. 12 is a schematic diagram of the word line driver substrate bias generator of FIG. 9 according to one embodiment of the present invention.

FIG. 12 illustrates one embodiment of the word line driver substrate bias generator NVGENP 945 of FIG. 9 in detailed schematic form. The NVGENP 945 receives a supply input voltage AVW on line 1102, an Erase and Erase Recovery signal on line 943, negative voltage NVPP on line 942, and a ground voltage GND on line 1120. The negative voltage NVPP on line 942 is provided by the negative voltage generator 940. The NVGENP 945 circuit operates to select between the negative voltage NVPP and the ground voltage GND for supply of the voltage HVDRPWI on coupled output lines 951 and 947 to the NVGEN 950 and word line drivers 970–974 respectively.

The NVGENP 945 includes p-channel MOS transistor MP3 which has its source and n-well coupled to the supply line 1102, its drain coupled to node 1214, and its gate coupled to line 1208. The Erase and Erase Recovery signal on line 943 is provided as the input to an inverter XI3, and the output of inverter XI3 is coupled to line 1208. P-channel MOS transistor MP4 has its source and n-well coupled to node 1102, its gate connected to the output of an inverter XI4 which has its input connected to node 1208. The drain of transistor MP4 is connected to node 1212. A triple well n-channel MOS transistor XM5 has its gate connected to node 1212, its drain connected to node 1214, and its source and p-well PWI connected to line 942 at which voltage NVPP is provided. The deep n-well NWD of transistor XM5 is coupled to the supply terminal $V_{DD}$. Triple well transistor XM6 has its drain coupled to node 1212, its gate coupled to node 1214, and its source and p-well coupled to line 942. The deep n-well of transistor XM6 is coupled to the supply terminal $V_{DD}$.

A triple well n-channel MOS transistor XM7 has its gate connected to node 1214, its drain connected to line 947, and its source and p-well PWI connected to line 942 at which voltage NVPP is provided. The deep n-well NWD of transistor XM7 is coupled to the supply terminal $V_{DD}$. A triple well n-channel MOS transistor XM8 has its gate connected to node 1212, its drain connected to line 947, its source connected to line 1120 at which ground voltage GND is provided, and p-well PWI is connected to line 942 at which voltage NVPP is provided. The deep n-well NWD of transistor XM8 is coupled to the supply terminal $V_{DD}$.

In operation, when the Erase and Erase Recovery signal on line 943 is high, the output of inverter XI3 on line 1208 is low. When the signal on line 1208 is low, transistor MP3 is turned on and transistor MP4 is turned off. This drives the voltage at node 1214 to the level of the supply input voltage AVW on line 1102 (typically 3 volts) thereby turning on transistors XM6 and XM7. Node 1212 is thereby driven to the voltage NVPP via transistor XM6, which in turn assures that transistors XM5 and XM8 are turned off. This voltage NVPP is thus applied to output line 947 through transistor XM7 while transistor XM8 is turned off. Transistor XM8 serves to isolate the negative voltage at line 947 from the ground potential on node 1120.

When the Erase and Erase Recovery signal on line 943 is low, the output of inverter XI3 on line 1208 is high. When the signal on line 1208 is high, transistor MP3 is turned off and transistor MP4 is turned on. This drives the voltage at node 1212 to the value of AVW thereby turning on transistors XM5 and XM8. Node 1214 is thereby driven to the voltage NVPP via transistor XM5, which in turn assures that transistors XM6 and XM7 are turned off. Therefore, the ground voltage GND on line 1120 is provided to the output line 947 through transistor XM8. Transistor XM7 serves to isolate the ground voltage at line 947 from the negative potential at line 942.

Figure 13:
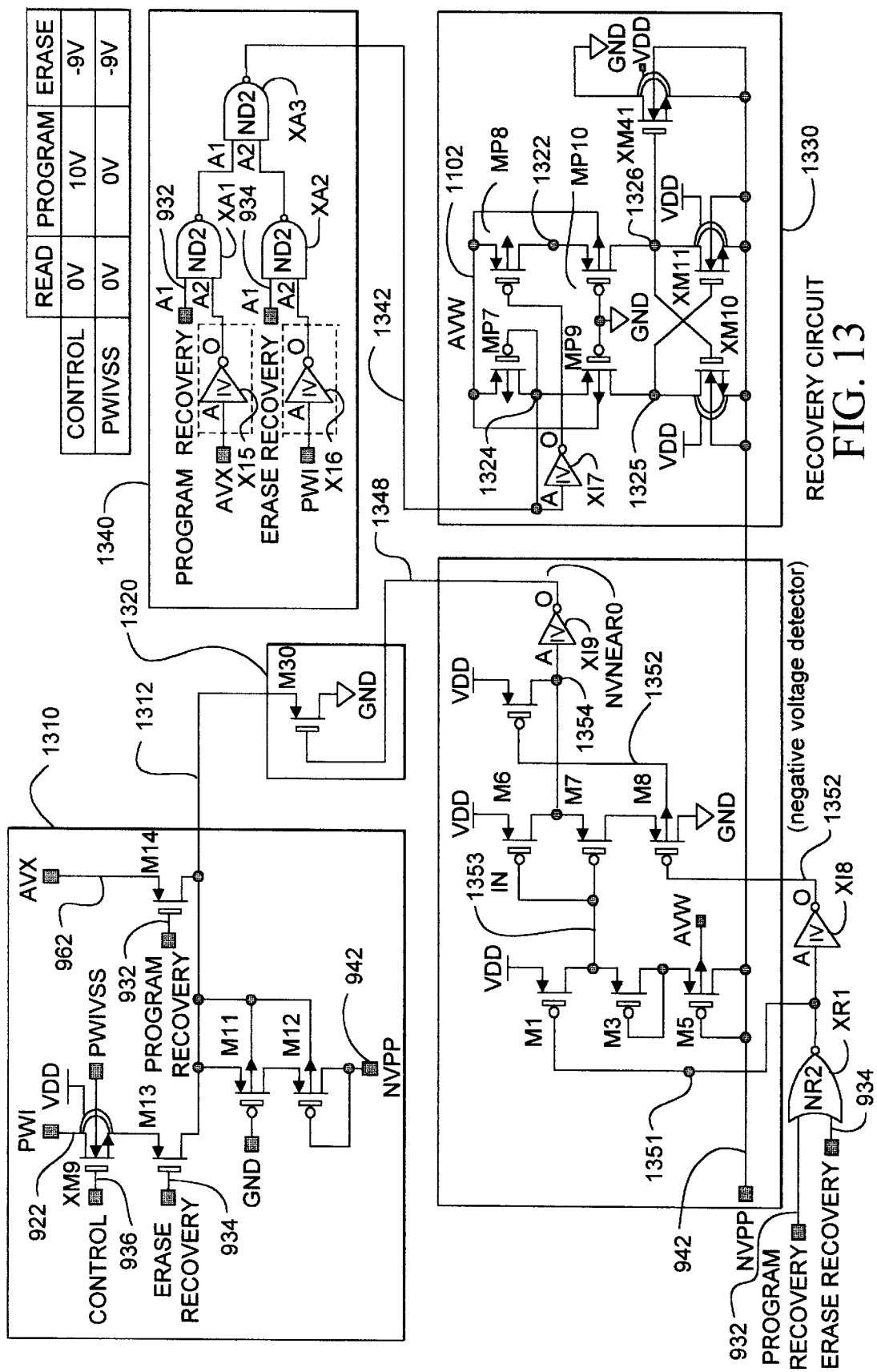
FIG. 13 is a schematic diagram of the recovery circuit of FIG. 9 according to one embodiment of the present invention.

FIG. 13 illustrates a schematic diagram of the recovery circuit 930 of FIG. 9 according to one embodiment of the present invention. The recovery circuit 930 comprises a positive voltage to negative voltage connection switch 1310, a positive voltage grounding circuit 1320, a negative voltage grounding circuit 1330, a positive voltage detector circuit 1340, and a negative voltage detector circuit 1350. The recovery circuit 930 receives the inputs AVX on node 962, PWI bias voltage on node 922, NVPP on node 942, Program Recovery signal on node 932, Erase Recovery signal on node 934, and Control signal on node 936. The recovery circuit 930 functions to recover the cells 981–986 from the program/erase operating voltages set forth previously in Table II by implementing the recovery scheme described above with respect to FIGS. 7 and 8 as will be described fully below.

The positive voltage to negative voltage connection switch 1310 provides an input to the positive voltage grounding circuit 1320 on node 1312 at the drain of transistor M30, and the negative voltage detector 1350 provides an input to the positive voltage grounding circuit 1320 on node 1348 at the gate of transistor M30. The output of the positive voltage detector circuit 1340 is provided on node 1342 as an input to the negative voltage grounding circuit 1330. The AVX voltage and the PWI bias voltage are provided to the positive voltage to negative voltage connection switch 1310 and the positive voltage detector circuit 1340 on nodes 962 and 922 respectively. The Control signal is provided to the positive voltage to negative voltage connection switch 1310 on node 936. The NVPP voltage is provided to the positive voltage to negative voltage connection switch 1310, the negative voltage grounding circuit 1330, and the negative voltage detector circuit 1350 on node 942. Finally, the Program Recovery signal and the Erase Recovery signal are provided to the positive voltage to negative voltage connection switch 13 10, the positive voltage detector circuit 1340, and the negative voltage detector circuit 1350 on nodes 932 and 934 respectively.

The positive voltage to negative voltage connection switch 1310 is comprised of n-channel MOS transistors M13 and M14, p-channel MOS transistors M11 and M12, and triple well n-channel MOS transistor XM9. The drain of transistor M14 is coupled to the AVX voltage on node 962, while the gate of M14 is coupled to the Program Recovery signal on node 932 and the source of M14 is coupled to node 1312. The drain of triple well transistor XM9 is coupled to the PWI bias voltage on node 922, while the gate of XM9 is coupled to the Control signal on node 936 and the source of XM9 is coupled to the drain of transistor M13. The gate of M13 is coupled to the Erase Recovery signal on node 934, and the source of M13 is coupled to node 1312. The drain and gate of transistor M12 is coupled to NVPP on node 942, and the source of M12 is coupled to the drain of transistor M11. The gate of M11 is connected to ground and the source of M11 is coupled to node 1312. The positive voltage to negative voltage connection switch 1310 corresponds to and implements switches SW1 of FIG. 7 and SW4 of FIG. 8. MOS transistors M14, M11, and M12 constitute the neutralizing path for channel FN program (SW1 in FIG. 7), and MOS transistors XM9, M13, M11, and M12 constitute the neutralizing path for channel FN erase (SW4 in Fig, 8).

The positive voltage grounding circuit 1320 comprises n-channel MOS transistor M30 with its source coupled to ground, and its drain and gate coupled to nodes 1312 and 1348 respectively. Transistor M30 corresponds to and implements switches SW2 of FIG. 7, and SW6 of FIG. 8.

The negative voltage grounding circuit 1330 is comprised of p-channel MOS transistors MP7, MP8, MP9, and MP10, inverter XI7, and triple well n-channel transistors XM10, XM11, and XM41. The output of the positive voltage detector circuit on node 1342 is coupled to the gate of transistor MP7 and to the input of inverter XI7. The output of the inverter XI7 is coupled to the gate of transistor MP8. The sources of both MP8 and MP7 are coupled to the voltage AVW—the typical value of AVW is 3 volts during a program or erase function, and Vdd during other modes to reduce the stress that is applied on the MOS circuits when a negative voltage is generated during a program or erase function. The drains of MP7 and MP8 are coupled to nodes 1324 and 1322 respectively. Transistor MP9 has its source connected to node 1324, its gate connected to ground, and its drain connected to node 1325. Transistor MP1O has its source connected to node 1322, its gate connected to ground, and its drain connected to node 1326. The sources of triple well transistors XM10, XM11, and XM41 are coupled to NVPP on node 942. The drain of XM11 and the gates of XM10 and XM41 are coupled to node 1326. The gate of XM11 and the drain of XM10 are coupled to node 1325, while the drain of XM41 is coupled to ground. The negative voltage grounding circuit 1330 corresponds to and implements the switches SW3 of FIG. 7 and SW5 of FIG. 8.

The positive voltage detector 1340 is comprised of inverters XI5 and XM6, and NAND gates XA1, XA2, and XA3. NAND gate XA1 receives the Program Recovery signal as an input on node 932, and the output of inverter XM5 as a second input—the inverter XI5 receives the AVX voltage as an input on node 962. NAND gate XA2 receives the Erase Recovery signal as an input on node 934, and the output of inverter XM6 as a second input—the inverter XI6 receives the PWI bias voltage as an input on node 922. NAND gate XA3 receives the outputs of NAND gates XA1 and XA2 as inputs, and provides the output of the positive voltage detector circuit on node 1342. The positive voltage detector circuit 1340 corresponds to and implements the positive voltage detector 710 of FIG. 7, and the positive voltage detector 820 of FIG. 8.

The negative voltage detector circuit 1350 is comprised of n-channel MOS transistors M7 and M8, p-channel transistors M1, M3, M5, M6 and M9, NOR gate XR1, and inverters XI8 and XI9. NOR gate XR1 receives the Program Recovery and Erase Recovery signals as inputs on nodes 932 and 934 respectively—the output of NOR gate XR1 is provided to the gate of transistor M1, and as the input to inverter XI8. The source of transistor M1 is connected to the external system input voltage $V_{DD}$, and the drain of M1 is coupled to node 1353. M1 has a very long channel and acts like a resistor. The source of M3 is coupled to node 1353, and the gate and drain of M3 are coupled to the source of M5. The gate and drain of M5 are coupled to NVPP on node 942. Transistors M3 and M5 are diode configured such that the potential on node 1353 will be approximately equal to NVPP +2 $V_{TH}$. The source of M6 is connected to $V_{DD}$, while the gate of M6 is coupled to node 1353 and the drain is coupled to node 1354 and the drain of M7. The gate of M7 is coupled to node 1353, and the source is coupled to the drain of M8. The gate of M8 is coupled to node 1352, and the source of M8 is coupled to ground. The source of M9 is connected to $V_{DD}$, while the drain is coupled to node 1354 and the gate is coupled to node 1352. Finally, the inverter XI9 receives the signal on node 1354 as an input and provides the signal NVNEAR0 as an output on node 1348. The negative voltage detector circuit 1350 corresponds to and implements the negative voltage detector 720 of FIG. 7 and the negative voltage detector 810 of FIG. 8.

The operation of the recovery circuit 930 is described below with respect to three conditions: 1) when the circuit is in a mode other than recovery from program or erase, 2) recovery from a program function, and 3) recovery from an erase function. When the circuit is in any mode other than program or erase recovery the signals Program Recovery on node 932 and Erase Recovery on node 934 are both low. When these signals are both low, the recovery circuit keeps the grounding paths open thereby allowing for the normal operation of the flash memory circuit. For, with these signals both low the output of the NOR gate XR1 is high and the output of inverter XI8 is low thus keeping M9 turned on and node 1354 at approximately $V_{DD}$. This results in a low output from inverter XI9 which turns off M30 thereby opening the positive grounding switch 1320. Further, when these signals are both low, the output on node 1342 of the positive voltage detector 1340 will also be low. When the voltage at node 1342 is low, transistors MP7, MP9 and XM11 will turn on and provide a low voltage at the gate of XM41 which will keep XM41 turned off and thereby keep the negative voltage grounding path open.

As described previously, during a program function, the AVX generator 960 outputs +8 volt to the word line 971 of the cell 981 through word line driver 970. The negative voltage generator 940 generates a −9 volt NVPP on node 942, and this negative potential is then applied to the cells' PWI on node 922 by the PWI driver 920. At the same time, the NWD driver 910 outputs +3 volts on the cells' NWD, and the voltages HVDRVSS and HVDRPWI on nodes 952 and 947 are driven to ground by their drivers NVGEN 950 and NVGENP 945 respectively.

Once the program function is complete the recovery circuit operates to recover the voltages on the above nodes back to their read mode levels. In the program recovery period, the Program Recovery signal is high and the Erase Recovery signal is low, and the AVX generator 960 and negative voltage generator 940 enter a high-impedance state as follows. The positive charge AVX on the word lines is neutralized with PWI's negative charge through node 1312 when the transistor M14 is turned on by the high Program Recovery signal on node 932. This serves to further turn on transistors M11 and M12 thereby coupling the voltage AVX with the voltage NVPP and causing AVX to decrease and PWI to increase (since NVPP is applied to the cells' PWI, the AVX voltage is coupled to PWI). When AVX decreases to approximately 3 volts in one embodiment, the output of inverter XI5 will go high causing the output of NAND gate XA1 to go low and the output of NAND gate XA3 to go high on node 1342. Thus, when the AVX voltage reaches the desired level the positive voltage detector circuit 1340 provides a high output to the negative voltage grounding circuit 1330 on node 1342 Which turns on transistors MP8, MP10 and XM10, and turns off transistors MP7, MP9 and XM11. This turns on transistor XM41 and provides a path to ground for the voltage NVPP on node 942, and since NVPP is also connected to PWI by the PWI Driver 920, the PWI is shorted to ground, too.

The negative voltage detector circuit 1350 then operates to close the positive voltage grounding path. When the Program Recovery signal on node 932 is high, the output of the NOR gate XR1 is low thereby turning on transistor M1 and providing node 1353 with a voltage approximately equal to NVPP +2 $V_{TH}$. Further, the output of inverter XI8 is high thereby turning off transistor M9 and enabling the negative voltage detector circuit. When NVPP increases to approximately −2 volts in one embodiment, the voltage at node 1353 is high enough to turn on transistor M7 and thus provide for the lowering of the potential at node 1354 via a path through M6, M7 and M8. When the potential at node 1354 is thus lowered, the output of inverter XI9 will go high thus turning on transistor M30 and providing a grounding path for voltage AVX. Since voltage AVX is also connected to the word line 971 through the word line driver 970, the word line 971 is also grounded.

Lastly, with respect to a recovery from an erase function, the recovery circuit 930 operates in a similar manner. As described previously, during an erase function, the PWI Driver 920 applies +6 volts on the cells' PWI via node 922, and the negative voltage generator 940 generates a −9 volt NVPP on node 942. The NVGENP 945 connects the NVPP voltage to HVDRPWI on node 947, and the NVGEN 950 connects the HVDRPWI to HVDRVSS on node 952. Thus, negative voltage is passed to the word lines via the word line drivers and nodes 947 and 952.

Once the erase function is complete the recovery circuit operates to recover the voltages on the above nodes back to their read mode levels. In the erase recovery period, the Erase Recovery signal is high and the Program Recovery signal is low, and the negative voltage generator 940 and PWI Driver 920 enter a high-impedance state as follows. The positive charge PWI is neutralized with the negative voltage on the word lines via node 1312 when the transistor M13 is turned on by the high Erase Recovery signal on node 934. This serves further to turn on transistors M11 and M12 thereby coupling the voltage PWI with the voltage NVPP and causing PWI to decrease and word line voltage to increase (since NVPP is applied to the word lines). When PWI decreases to approximately 3 volts in one embodiment, the output of inverter XI6 will go high causing the output of NAND gate XA2 to go low and the output of NAND gate XA3 to go high on node 1342. This turns on transistors MP8, MP10 and XM10, and turns off transistors MP7, MP9 and XM11. This turns on transistor XM41 and provides a path to ground for the voltage NVPP on node 942, and since NVPP is also connected to the word lines, the word lines are shorted to ground, too. The negative voltage detector circuit 1350 then operates as discussed previously to close the positive voltage grounding path for voltage PWI.

Although illustrative embodiments of the invention have been described in detail herein with reference to the accompanying drawings, it is to be understood that the invention is not limited to those precise embodiments. They are not intended to be exhaustive or to limit the invention to the precise forms disclosed. As such, many modifications and variations will be apparent to practitioners skilled in this art. Accordingly, it is intended that the scope of the invention be defined by the following claims and their equivalents.

What is claimed is:

1. In a floating gate memory cell comprising a control gate, a floating gate, a channel well having a first conductivity type, the first conductivity type being one of p-type and n-type, and drain and source regions within the channel well having a second conductivity type that is different than the first conductivity type, and wherein the control gate is coupled to a first node at a first program/erase potential and the channel well is coupled to a second node at a second program/erase potential, a method for recovering the control gate to a first recovery potential and the channel well to a second recovery potential, the method comprising:

completing a current path between the first node and the second node;

generating a first grounding signal when the voltage potential at the first node approximately equals a first switching potential;

generating a second grounding signal when the voltage potential at the second node approximately equals a second switching potential;

providing an electrical path between the second node and a first reference node in response to the first grounding signal, biasing the first reference node at the second recovery potential; and providing an electrical path between the first node and a second reference node in response to the second grounding signal, biasing the second reference node at the first recovery potential.

2. The method of claim 1, wherein the first conductivity type is p-type.

3. The method of claim 1, wherein the first switching potential is a positive voltage and the second switching potential is a negative voltage.

4. The method of claim 3, wherein the first switching potential is approximately +3 volts and the second switching potential is approximately −2 volts.

5. The method of claim 1, wherein the first switching potential is a negative voltage and the second switching potential is a positive voltage.

6. The method of claim 5, wherein the first switching potential is approximately −2 volts and the second switching potential is approximately +3 volts.

7. The method of claim 1, wherein the first reference node is coupled to a node at ground potential.

8. The method of claim 7, wherein the first reference node is coupled to the second reference node.

9. The method of claim 1, wherein the first program/erase potential is a positive voltage, and the second program/erase potential is a negative voltage.

10. The method of claim 9, wherein the floating gate memory cell further comprises an external reference supply applying a ground potential and a positive supply potential.

11. The method of claim 10, wherein the supply potential is specified at 5 volts or less.

12. The method of claim 1, wherein the first program/erase potential is a negative voltage, and the second program/erase potential is a positive voltage.

13. The method of claim 12, wherein the floating gate memory cell further comprises an external reference supply applying a ground potential and a positive supply potential, and the magnitude of the second program/erase potential is higher than the supply potential.

14. The method of claim 13, wherein the second program/erase potential has a magnitude in a range from near the supply voltage level to positive 14 volts, and the first program/erase potential has a magnitude in a range from negative 4 to negative 10 volts.

15. The method of claim 13, wherein the supply voltage is specified at 5 volts or less.

16. The method of claim 1, wherein the floating gate memory cell comprises a triple-well transistor on an integrated circuit having a substrate with the first conductivity type, the substrate including an isolation well having the second conductivity type, and wherein the channel well is within the isolation well.

17. The method of claim 16, wherein the first conductivity type is p-type.

18. An operating method for a floating gate memory cell, including a drain, a source, a floating gate and a control gate, on a semiconductor substrate having a first conductivity type, the substrate including an isolation well having a second conductivity type different than the substrate, a channel well within the isolation well having the first conductivity type, and source and drain regions for the cell having the second conductivity type within the channel well, and wherein the control gate is coupled to a first node and the channel well is coupled to a second node, the method comprising:

inducing tunneling current between the floating gate and the channel well by applying a first program/erase potential to the first node, a second program/erase potential to the second node, a third program/erase potential to the isolation well and a fourth program/erase potential to the substrate, the first and second program/erase potentials establishing an electric field between the control gate and the channel well sufficient to induce tunneling current, the third potential set so that current between the channel well and the isolation well is blocked, and the forth potential set so that current between the isolation well and substrate is blocked;

recovering the first program/erase potential to a first recovery potential and the second program/erase potential to a second recovery potential, wherein recovering the first program/erase potential and the second program/erase potential comprises:

completing a current path between the first node and the second node;

generating a first grounding signal when the voltage potential at the first node approximately equals a first switching potential;

generating a second grounding signal when the voltage potential at the second node approximately equals a second switching potential;

providing an electrical path between the second node and a first reference node in response to the first grounding signal, biasing the first reference node at the second recovery potential; and providing an electrical path between the first node and a second reference node in response to the second grounding signal, biasing the second reference node at the first recovery potential.

19. The operating method of claim 18, wherein the first switching potential is a positive voltage and the second switching potential is a negative voltage.

20. The operating method of claim 19, wherein the first switching potential is approximately +3 volts and the second switching potential is approximately −2 volts.

21. The operating method of claim 18, wherein the first switching potential is a negative voltage and the second switching potential is a positive voltage.

22. The operating method of claim 21, wherein the first switching potential is approximately −2 volts and the second switching potential is approximately +3 volts.

23. The operating method of claim 18, wherein the first reference node is coupled to a node at ground potential.

24. The operating method of claim 23, wherein the first reference node is coupled to the second reference node.

25. The operating method of claim 18, wherein the first program/erase potential is a positive voltage, and the second program/erase potential is a negative voltage.

26. The operating method of claim 25, wherein the substrate is coupled to an external reference supply applying a ground potential and a positive supply potential.

27. The operating method of claim 26, wherein the supply potential is specified at 5 volts or less.

28. The operating method of claim 18, wherein the first program/erase potential is a negative voltage, and the second program/erase potential is a positive voltage.

29. The operating method of claim 28, wherein the substrate is coupled to an external reference supply applying a ground potential and a positive supply potential, and the magnitude of the second program/erase potential is higher than the supply potential.

30. The operating method of claim 29, wherein the second program/erase potential has a magnitude in a range from near the supply voltage level to positive 14 volts, and the first program/erase potential has a magnitude in a range from negative 4 to negative 10 volts.

31. The operating method of claim 29, wherein the supply potential is specified at 5 volts or less.

32. A recovery circuit for recovering a control gate and a channel well of a floating gate memory cell to a first recovery potential and a second recovery potential respectively, wherein the floating gate memory cell comprises the control gate coupled to a first node at a first program/erase potential, a floating gate, the channel well coupled to a second node at a second program/erase potential having a first conductivity type, the first conductivity type being one of p-type and n-type, and drain and source regions within the channel well having a second conductivity type that is different than the first conductivity type, the recovery circuit comprising:

control circuitry that provides a recovery control signal;
a coupling circuit that completes a current path between the first node and the second node in response to the recovery control signal;
a first voltage detector circuit responsive to the recovery control signal that provides a first grounding signal when the voltage potential at the first node approximately equals a first switching potential;
a second voltage detector circuit responsive to the recovery control signal that provides a second grounding signal when the voltage potential at the second node approximately equals a second switching potential;
a first voltage grounding circuit responsive to the first grounding signal that provides an electrical path between the second node and a first reference node, biasing the first reference node at the second recovery potential; and
a second voltage grounding circuit responsive to the second grounding signal that provides an electrical path between the first node and a second reference node, biasing the second reference node at the first recovery potential.

33. The recovery circuit of claim 32, wherein the first conductivity type is p-type.

34. The recovery circuit of claim 32, wherein the first switching potential is a positive voltage and the second switching ntia is a negative voltage.

35. The recovery circuit of claim 34, wherein the first switching potential is approximately +3 volts and the second switching potential is approximately −2 volts.

36. The recovery circuit of claim 32, wherein the first switching potential is a negative voltage and the second switching potential is a positive voltage.

37. The recovery circuit of claim 36, wherein the first switching potential is approximately −2 volts and the second switching potential is approximately +3 volts.

38. The recovery circuit of claim 32, wherein the first reference node is coupled to a node at ground potential.

39. The recovery circuit of claim 38, wherein the first reference node is coupled to the second reference node.

40. The recovery circuit of claim 32, wherein the first program/erase potential is a positive voltage, and the second program/erase potential is a negative voltage.

41. The recovery circuit of claim 40, wherein the floating gate memory cell further comprises an external reference supply applying ground potential and a positive supply potential.

42. The recovery circuit of claim 41, wherein the supply potential is specified at 5 volts or less.

43. The recovery circuit of claim 32, wherein the first program/erase potential is a negative voltage, and the second program/erase potential is a positive voltage.

44. The recovery circuit of claim 43, wherein the floating gate memory cell further comprises an external reference supply applying a ground potential and a positive supply potential, and the magnitude of the second program/erase potential is higher than the supply potential.

45. The recovery circuit of claim 44, wherein the second program/erase potential has a magnitude in a range from near the supply voltage level to positive 14 volts, and the first program/erase potential has a magnitude in a range from negative 4 to negative 10 volts.

46. The recovery circuit of claim 44, wherein the supply voltage is specified at 5 volts or less.

47. A floating gate memory cell in a semiconductor substrate including a region having a first conductivity type, the first conductivity type being one of n-type and p-type, the floating gate memory cell comprising:

a floating gate structure over a channel area;
a control gate structure over the floating gate structure, and coupled to a first node;
a first well within the region of the substrate having a second conductivity type, being one of n-type and p-type and different than the first conductivity type;
a second well within the first well, having the first conductivity type, and coupled to a second node;
a drain within the second well, having the second conductivity type;
a source within the second well, having the second conductivity type, and spaced away from the drain to define the channel area between the drain and the source;
program/erase voltage driver circuitry to induce tunneling of electrons one of out of the floating gate into the channel area and out of the channel area into the floating gate by applying a first program/erase potential to the first node, a second program/erase potential to the second node, a third program/erase potential to the first well and a fourth program/erase potential to the substrate, the first and second program/erase potentials establishing an electric field between the control gate and the channel well sufficient to induce tunneling current, the third potential set so that current between the channel well and the first well is blocked, and the fourth potential set so that current between the first well and the substrate is blocked; and
a recovery circuit that recovers the control gate to a first recovery potential and the second well to a second recovery potential, wherein the recovery circuit further comprises:
control circuitry responsive to the program/erase voltage driver circuitry that provides a recovery control signal;
a coupling circuit that completes a current path between the first node and the second node in response to the recovery control signal;
a first voltage detector circuit responsive to the recovery control signal that provides a first grounding signal when the voltage potential at the first node approximately equals a first switching potential;
a second voltage detector circuit responsive to the recovery control signal that provides a second grounding signal when the voltage potential at the second node approximately equals a second switching potential;
a first voltage grounding circuit responsive to the first grounding signal that provides an electrical path between the second node and a first reference node, biasing the first reference node at the second recovery potential; and a second voltage grounding circuit responsive to the second grounding signal that provides an electrical path between the first node and a second reference node, biasing the second reference node at the first recovery potential.

48. The floating gate memory cell of claim 47, wherein the first conductivity type is p-type.

49. The floating gate memory cell of claim 47, wherein the first switching potential is a positive voltage and the second switching potential is a negative voltage.

50. The floating gate memory cell of claim 49, wherein the first switching potential is approximately +3 volts and the second switching potential is approximately −2 volts.

51. The floating gate memory cell of claim 47, wherein the first switching potential is a negative voltage and the second switching potential is a positive voltage.

52. The floating gate memory cell of claim 51, wherein the first switching potential is approximately −2 volts and the second switching potential is approximately +3 volts.

53. The floating gate memory cell of claim 47, wherein the first reference node is coupled to a node at ground potential.

54. The floating gate memory cell of claim 53, wherein the first reference node is coupled to the second reference node.

55. The floating gate memory cell of claim 47, wherein the first program/erase potential is a positive voltage, and the second program/erase potential is a negative voltage.

56. The floating gate memory cell of claim 55, wherein the substrate is coupled to an external reference supply applying a ground potential and a positive supply potential.

57. The floating gate memory cell of claim 56, wherein the supply potential is specified at 5 volts or less.

58. The floating gate memory cell of claim 47, wherein the first program/erase potential is a negative voltage, and the second program/erase potential is a positive voltage.

59. The floating gate memory cell of claim 58, wherein the substrate is coupled to an external reference supply applying a ground potential and a positive supply potential, and the magnitude of the second program/erase potential is higher than the supply potential.

60. The floating gate memory cell of claim 59, wherein the second program/erase potential has a magnitude in a range from near the supply voltage level to positive 14 volts, and the first program/erase potential has a magnitude in a range from negative 4 to negative 10 volts.

61. The floating gate memory cell of claim 59, wherein the supply voltage is specified at 5 volts or less.

* * * * *